(12) United States Patent
Shimizu et al.

(10) Patent No.: US 8,624,264 B2
(45) Date of Patent: Jan. 7, 2014

(54) SEMICONDUCTOR DEVICE WITH LOW RESISTANCE SIC-METAL CONTACT

(75) Inventors: Tatsuo Shimizu, Tokyo (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 13/213,561

(22) Filed: Aug. 19, 2011

(65) Prior Publication Data

US 2012/0228630 A1    Sep. 13, 2012

(30) Foreign Application Priority Data

Mar. 7, 2011   (JP) .................................. 2011-048646

(51) Int. Cl.
  *H01L 29/15*   (2006.01)
(52) U.S. Cl.
  USPC ..................................... 257/77; 257/E21.409
(58) Field of Classification Search
  USPC .............................. 257/77, E21.409, E29.255
  See application file for complete search history.

(56) References Cited

FOREIGN PATENT DOCUMENTS

| JP | 3-235377 A | 10/1991 |
| JP | 03235377 A * | 10/1991 .............. H01L 33/00 |
| JP | 4179492 | 9/2008 |

OTHER PUBLICATIONS

Japanese Office Action Issued Feb. 12, 2013 in Patent Application No. 2011-048646 (with English translation).
U.S. Appl. No. 13/404,411, filed Feb. 24, 2012, Shimizu, et al.

* cited by examiner

*Primary Examiner* — Evan Pert
*Assistant Examiner* — Selim Ahmed
(74) *Attorney, Agent, or Firm* — Oblon, Spivak, McClelland, Maier & Neustadt, L.L.P.

(57) ABSTRACT

A semiconductor device according to an embodiment includes a first electrode and a first silicon carbide (SiC) semiconductor part. The first electrode uses a conductive material and the first silicon carbide (SiC) semiconductor part is connected to the first electrode, in which at least one element of magnesium (Mg), calcium (Ca), strontium (Sr), and barium (Ba) is contained in an interface portion with the first electrode in such a way that a surface density thereof peaks, and whose conduction type is a p-type.

18 Claims, 22 Drawing Sheets n-SiC/Reduction Of Contact Resistance Of n-Sic/Metal Junction p-SiC/Reduction Of Contact Resistance Of p-Sic/Metal Junction

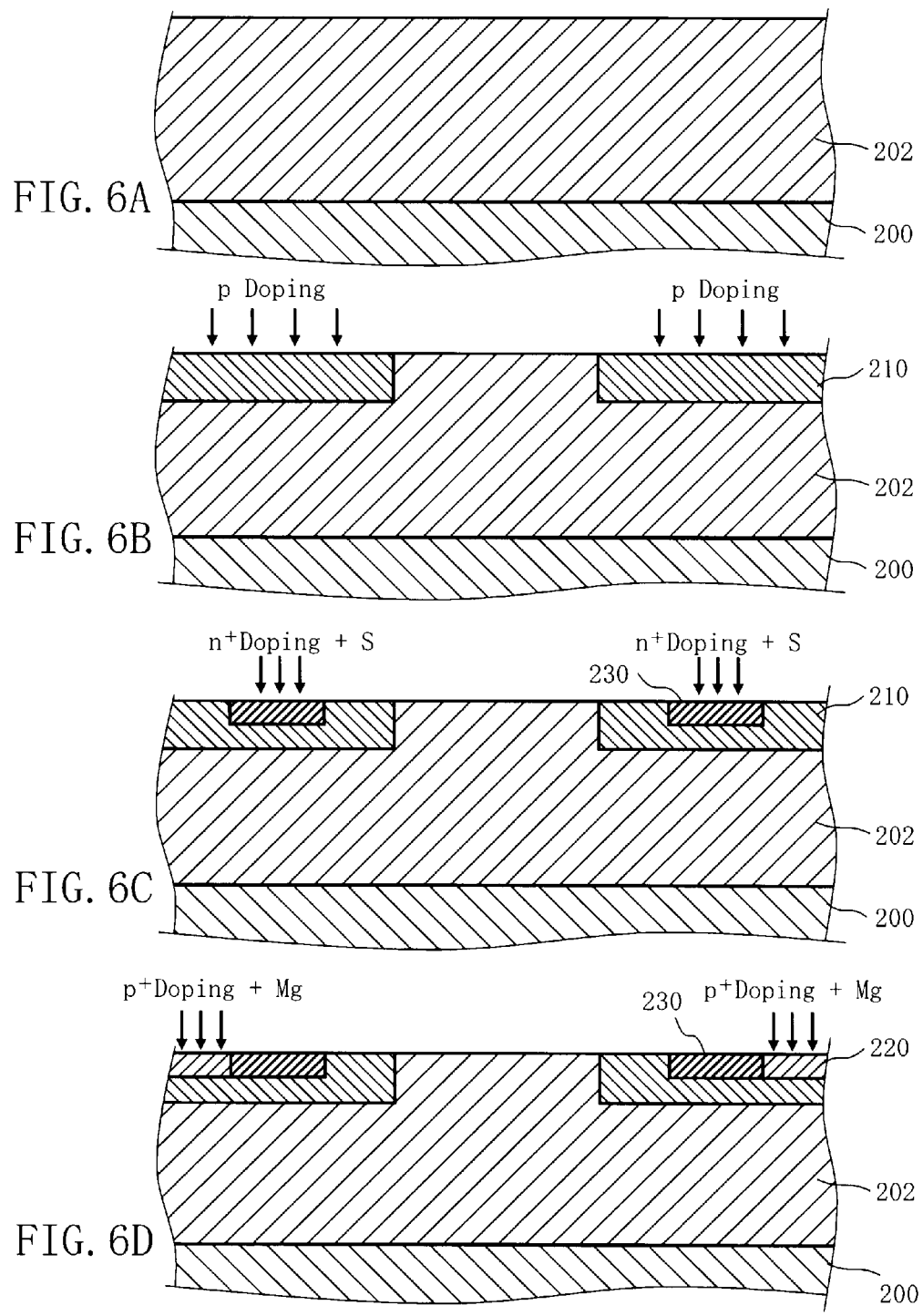

SEMICONDUCTOR DEVICE WITH LOW RESISTANCE SIC-METAL CONTACT

CROSS-REFERENCE TO RELATED APPLICATION

This application is based upon and claims the benefit of priority from Japanese Patent Application No. 2011-048646 filed on Mar. 7, 2011 in Japan, the entire contents of which are incorporated herein by reference.

FIELD

Embodiments described herein relate to a semiconductor device and a method for fabricating the semiconductor device.

BACKGROUND

In a semiconductor element, low-resistance contact between an n-type semiconductor region and metal is needed. Similarly, low-resistance contact between a p-type semiconductor region and metal is needed. In a semiconductor element based on, for example, silicon (Si), the sum of barrier between an n-type region or p-type region and a metal for the same metal is about 1 eV of the magnitude of a bandgap. In this case, a sufficiently low contact resistance can be obtained by sufficiently increasing the amount of dopant in both regions. That is, the barrier can be set sufficiently low and a sufficient amount of dopant can be introduced for activation and thus, forming simultaneous contact to both the n-type semiconductor region and the p-type semiconductor region does not pose a big problem.

In a silicon carbide (SiC) power semiconductor device, however, the sum of barrier between an n-type semiconductor region or p-type semiconductor region and a metal for the same metal amounts to about 3 eV of the magnitude of a bandgap. Thus, for use of the semiconductor device as a product, steps are needed such as using different metals for electrodes between the n-type region and the p-type region to reduce the resistance. It is also necessary to introduce the dopant in higher concentrations to reduce the resistance and further, a long-term high-temperature process is needed for activation. An interface between, for example, an SiC semiconductor and a dielectric film is caused to deteriorate by the high-temperature process. Thus, it is desirable to reduce the resistance at a lower temperature.

Regarding contact between, for example, a large n-type SiC region and metal, a satisfactory value to some extent is obtained for a reduction of resistance by using an interface reaction layer in a high-temperature process. Regarding contact between a p-type SiC region and metal, however, an obtained value cannot be said to be entirely satisfactory even for a large region. This stems from material characteristics of the material SiC. That is, the material itself has a large bandgap. This is an intrinsic problem of a wide bandgap semiconductor because any electrode capable of making low-resistance contact with an n-type SiC region has a barrier to a p-type SiC region as large as the bandgap.

As described above, for low-resistance contact between an n-type SiC region and metal, there is a problem that a high-temperature process is needed. For low-resistance contact between a p-type SiC region and metal, there is a problem that even realization thereof is insufficient with the same metal as that of the n-type SiC region. Thus, there is a problem that the type of metal to be used is sharply restricted.

BRIEF DESCRIPTION OF THE DRAWINGS

FIGS. 6A to 6D are process sectional views showing processes undergone corresponding to the flowchart of the method for fabricating the semiconductor device according to the first embodiment;

DETAILED DESCRIPTION

First Embodiment

Figure 1:
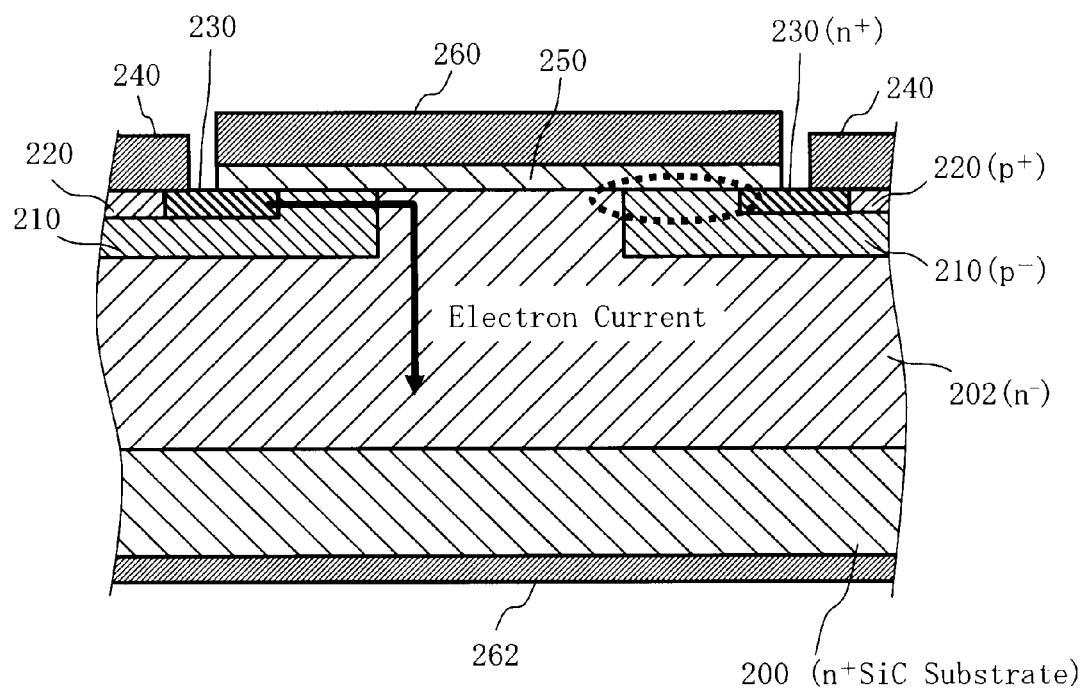
FIG. 1 is a sectional view showing a configuration of a semiconductor device according to a first embodiment.

A semiconductor device according to an embodiment includes an electrode and a silicon carbide (SiC) semiconductor part. The electrode uses a conductive material and the silicon carbide (SiC) semiconductor part is connected to the electrode, in which at least one element of magnesium (Mg), calcium (Ca), strontium (Sr), and barium (Ba) is contained in an interface portion with the electrode in such a way that a surface density thereof peaks, and whose conduction type is a p-type.

A semiconductor device according to an embodiment includes an electrode and a silicon carbide (SiC) semiconductor part. The electrode uses a conductive material and the silicon carbide (SiC) semiconductor part is connected to the electrode, in which at least one element of sulfur (S), selenium (Se), and tellurium (Te) is contained in an interface portion with the electrode in such a way that a surface density thereof peaks, and whose conduction type is an n-type.

A semiconductor device according to an embodiment includes an electrode, a silicon carbide (SiC) semiconductor part whose conduction type is a p-type, and a silicon carbide (SiC) semiconductor part whose conduction type is an n-type. The electrode uses a conductive material. The p-type SiC semiconductor part is connected to the electrode and contains at least one element of magnesium (Mg), calcium (Ca), strontium (Sr), and barium (Ba) in an interface portion with the electrode in such a way that a surface density thereof peaks, and the n-type SiC semiconductor part is connected to the electrode and contains at least one element of sulfur (S), selenium (Se), and tellurium (Te) in an interface portion with the electrode in such a way that a surface density thereof peaks.

A method for fabricating a semiconductor device according to an embodiment includes forming an SiC semiconductor layer whose conduction type is an n-type on a silicon carbide (SiC) substrate; forming a first SiC semiconductor region on at least a portion of the SiC semiconductor layer, wherein the first SiC semiconductor region has a p-type conduction type; forming an n-type second SiC semiconductor region selectively on at least a portion of the first SiC semiconductor regions; implanting at least one element of sulfur (S), selenium (Se), and tellurium (Te) into the second SiC semiconductor region; forming a p-type third SiC semiconductor region selectively in a position of the first SiC semiconductor regions and adjacent to the second SiC semiconductor region; and forming a first electrode connected to the second and third SiC semiconductor regions.

In the present embodiment, a semiconductor device enabling realization of low-resistance contact between a p-type SiC region and metal will be described below. Also, a semiconductor device enabling realization of low-resistance contact between an n-type SiC region and metal will be described. Further, a semiconductor device enabling realization of low-resistance contact to both the n-type SiC region and the p-type SiC region with the same metal will be described. The first embodiment will be described below using the drawings.

In FIG. 1, as an example, a structure section of DiMOSFET (Double Implanted Metal Oxide Semiconductor Field Effect Transistor) is shown. In FIG. 1, a low-concentration n-type ($n^-$) SiC semiconductor layer 202 is formed and arranged on the surface of a high-concentration n-type ($n^+$) silicon carbide (SiC) semiconductor substrate 200. The ($n^-$) SiC semiconductor layer 202 is formed with an impurity concentration lower than that of the ($n^+$) SiC semiconductor substrate 200. The ($n^-$) SiC semiconductor layer 202 becomes a withstand voltage holding layer. The ($n^+$) SiC semiconductor substrate 200 is an example of an n-type silicon carbide (SiC) semiconductor part.

An electrode 262 of a conductive material is connected to the back side of the ($n^+$) SiC semiconductor substrate 200 and arranged thereon. The electrode 262 becomes a drain electrode. The electrode 262 becomes an example of a third electrode or an example of a second electrode. In this case, the ($n^+$) SiC semiconductor substrate 200 contains at least one element of sulfur (S), selenium (Se), and tellurium (Te) in an interface portion with the electrode 262 in such a way that the surface density thereof peaks. The electrode 262 is ohmically connected to the back side of the ($n^+$) SiC semiconductor substrate 200.

A plurality of low-concentration p-type ($p^-$) SiC semiconductor regions 210 with a predetermined film thickness is formed and arranged in a portion of the surface of the ($n^-$) SiC semiconductor layer 202 with mutual spacing therebetween selectively up to a certain depth inside the ($n^-$) SiC semiconductor layer 202 from the surface thereof. The ($p^-$) SiC semiconductor region 210 is an example of a third semiconductor part. In one semiconductor element, the two p-type ($p^-$) SiC semiconductor regions 210 are arranged so as to sandwich a region of the ($n^-$) SiC semiconductor layer 202 therebetween. A high-concentration n-type ($n^+$) SiC semiconductor region 230 with a predetermined film thickness is selectively formed and arranged in a portion of the surface of each of the ($p^-$) SiC semiconductor regions 210 up to a certain depth inside the ($p^-$) SiC semiconductor region 210 from the surface thereof. Then, a p-type ($p^+$) SiC semiconductor region 220 is arranged adjacent to the n-type ($n^+$) SiC semiconductor region 230 in a portion of the surface of each of the ($p^-$) SiC semiconductor regions 210. Thus, the plurality of p-type ($p^-$) SiC semiconductor regions 210 is selectively formed on at least a portion of the ($n^-$) SiC semiconductor layer 202 and arranged by being connected to the n-type ($n^+$) SiC semiconductor region 230 and the p-type ($p^+$) SiC semiconductor region 220. In the example in FIG. 1, one n-type ($n^+$) SiC semiconductor region 230 and one p-type ($p^+$) SiC semiconductor region 220 adjacent to each other are arranged in a portion of the surface of each of the ($p^-$) SiC semiconductor regions 210. When one semiconductor element is formed, the two p-type ($p^+$) SiC semiconductor regions 220 are arranged so as to sandwich the two n-type ($n^+$) SiC semiconductor regions 230 therebetween. In other words, the p-type ($p^+$) SiC semiconductor region 220 is arranged outside the n-type ($n^+$) SiC semiconductor region 230. Also, each of the ($p^-$) SiC semiconductor regions 210 has a channel region electrically conducting to the ($n^-$) SiC semiconductor layer 202 formed on an inner side from the n-type ($n^+$) SiC semiconductor region 230.

A dielectric film 250 is formed by extending over a portion of the surface of the two n-type ($n^+$) SiC semiconductor regions 230. As the dielectric film 250, for example, an $SiO_2$ oxide film is used. The dielectric film 250 is formed by being in contact with the surface of the n-type ($n^+$) SiC semiconductor regions 230 on both sides, the surface of each of the ($p^-$) SiC semiconductor regions 210 where neither n-type ($n^+$) SiC semiconductor region 230 nor the p-type ($p^+$) SiC semiconductor region 220 is formed, and the surface of the ($n^-$) SiC semiconductor layer 202 to be an inter-channel region between the two ($p^-$) SiC semiconductor regions 210. An electrode 260 is formed on the dielectric film 250. The dielectric film 250 is an example of a gate dielectric film. Thus, the electrode 260 is formed via the dielectric film 250 so as to extend over the n-type ($n^+$) SiC semiconductor regions 230 on both sides, a partial region of each of the ($p^-$) SiC semiconductor regions 210 where neither n-type ($n^+$) SiC semiconductor region 230 nor the p-type ($p^+$) SiC semiconductor region 220 is formed, and the ($n^-$) SiC semiconductor layer 202 to be an inter-channel region between the two ($p^-$) SiC semiconductor regions 210. The electrode 260 becomes a gate electrode. The electrode 260 becomes an example of a second electrode.

An electrode 240 is formed in another portion of the surface of the n-type ($n^+$) SiC semiconductor region 230 and on the surface of the p-type ($p^+$) SiC semiconductor region 220. The electrode 240 becomes a source electrode. The electrode 240 becomes an example of a first electrode.

The p-type ($p^+$) SiC semiconductor region 220 contains at least one element of magnesium (Mg), calcium (Ca), strontium (Sr), and barium (Ba) in an interface portion with the electrode 240 in such a way that the surface density thereof peaks. The electrode 240 is ohmically connected to the p-type ($p^+$) SiC semiconductor region 220. The p-type ($p^+$) SiC semiconductor region 220 becomes a substrate contact region in MOS. The p-type ($p^+$) SiC semiconductor region 220 is an example of a first SiC semiconductor part.

On the other hand, the n-type ($n^+$) SiC semiconductor region 230 contains at least one element of sulfur (S), selenium (Se), and tellurium (Te) in an interface portion with the electrode 240 in such a way that the surface density thereof peaks. The electrode 240 is ohmically connected to the n-type ($n^+$) SiC semiconductor region 230. The n-type ($n^+$) SiC semiconductor region 230 becomes a source region in MOS. The n-type ($n^+$) SiC semiconductor region 230 is an example of an SiC semiconductor part or a second SiC semiconductor part.

In the first embodiment, SiC is co-doped with a "dopant" (nitrogen (N) or phosphorus (P) is introduced for the n-type and boron (B) or aluminum (Al) for the p-type) with a smaller ion radius and a "pinning material" with a larger ion radius. S, Se, or Te is introduced in an n-type interface and Mg, Ca, Sr, or Ba is introduced in a p-type interface. When SiC is used, high-temperature (for example, 1700° C.)/long-term (for example, 30 min) annealing is needed to introduce a sufficient amount of dopant for activation, one cause therefor is that the dopant to be used is small. If an element having a larger ion diameter is co-doped, distortion during introduction is eased, which makes direct introduction into lattice points easier. On the other hand, if only the "pinning material" is introduced, the ion radius is too large, which makes introduction into SiC difficult. Thus, by combining the "dopant" and "pinning material", more of these materials can be introduced into SiC. SiC has a smaller lattice and thus, an introduced material is diffused extremely slowly compared with Si, which is a big difference from Si. In Si, the introduced material is uniformly diffused throughout the Si film. In SiC, by contrast, a distribution close to the initial state of introduction can be obtained even after high-temperature annealing.

As described above, the "dopant" with a smaller ion radius and the "pinning material" with a larger ion radius can advantageously be introduced more easily by both being introduced simultaneously. It is difficult for the dopant to be introduced into SiC and particularly it is difficult to produce a high concentration of the dopant. However, a high concentration of the dopant can easily be produced by co-doping. That is, while high-temperature long-term annealing at 1700° C. for 30 min or so has been needed, it turns out that annealing at 1050° C. for 1 min or so is effective with co-doping. The "pinning material" of n-type has two more electrons and thus, even a deep state hardly affects the n-type conduction. The p-type similarly lacks two electrons and even a deep state hardly affects the p-type conduction. Therefore, it turns out that the "pinning material" is also effective as an "assist material of introduction and activation" of the "dopant". It turns out that the "pinning material" is an important additive element not only as the "pinning material", but also as a material that makes the dopant easier to use (migration to annealing at a lower temperature for a shorter time).

It has been revealed that many materials diffuse fast in Si and the distribution thereof spreads and thus, if S, Se, or Te is introduced into Si for later diffusion, it is difficult to concentrate the element in an interface. In SiC, by contrast, the diffusion of the "pinning material" is slow due to a smaller lattice constant and as shown below, it is more advantageous to pile up in an n-type SiC/metal interface than being inside. Similarly, it has been revealed that if Mg, Ca, Sr, or Ba is introduced into Si for later diffusion, it is difficult to concentrate the element in an interface. In SiC, by contrast, the diffusion of the "pinning material" is slow and it is more advantageous to pile up in a p-type SiC/metal interface than being inside.

Figures 2A, 2B:
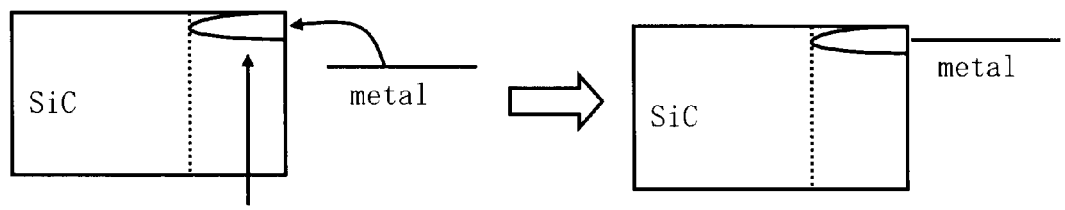
FIGS. 2A and 2B are conceptual diagrams for explaining a reduction of resistance of a junction between n-type SiC and metal in the first embodiment.

As shown in FIG. 2A, the additive elements S, Se, and Te (denoted as an additive element D) create a state at the bottom of a conduction band of SiC. If these additive elements are in an interface between n-SiC and metal, electrons are emitted to the metal to form a dipole in the interface. Thus, as shown in FIG. 2B, the effective work function of the metal moves in a smaller (shallower) direction. In this case, the system as a whole is energetically advantageous by the amount of transfer of electrons. In this manner, these additive elements D pile up in the interface. For the mechanism of gain to work, it is clear that the metal to be used with a larger work function (larger than 4.2 eV) piles up more in the interface. If a metal material having a work function smaller than 4.2 eV is used, while this mechanism does not work, the junction becomes a sufficiently ohmic junction in the first place. Many actual metals are considered to have a work function larger than 4.3 eV and thus, an ohmic connection is automatically created by the additive element D such as S, Se, and Te being piled up in the n-SiC/metal interface.

Figures 3A, 3B:
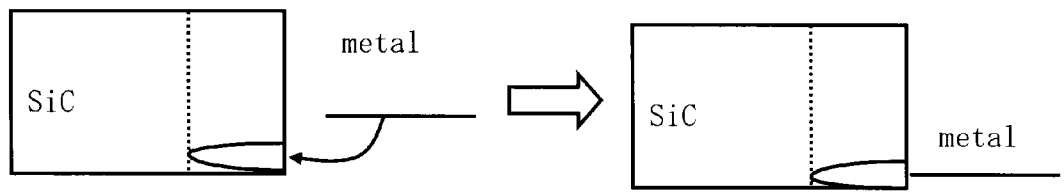
FIGS. 3A and 3B are conceptual diagrams for explaining the reduction of resistance of the junction between p-type SiC and metal according to the first embodiment.

As shown in FIG. 3A, the additive elements Mg, Ca, Sr, and Ba (denoted as an additive element A) create a state immediately above a valence band of SiC. If these additive elements are in an interface between p-SiC and metal, electrons are obtained from the metal to form a dipole in the interface. Thus, as shown in FIG. 3B, the effective work function of the metal moves in a larger (deeper) direction. In this case, the system as a whole is energetically advantageous by the amount of transfer of electrons. In this manner, these additive elements A pile up in the interface. The work function of the metal to be used is at most 5.7 eV or so (for example, gold). The top of the valence band of SiC is very deep with 7.4 eV and thus, a large gain can be expected from the transfer of electrons from the metal. If a metal material having a work function larger than 7.4 eV is used, this mechanism is not needed and the junction is considered to become a sufficiently ohmic junction. Many actual metals are considered to have a work function smaller than 5.7 eV and thus, an ohmic connection is automatically created by the additive element A such as Mg, Ca, Sr, and Ba being piled up in the p-SiC/metal interface.

The work function of the metal used commonly is distributed in the range of 4.3 eV to 5.7 eV. Thus, an n-SiC/metal junction having a Schottky barrier of about 0.1 eV can be produced without much difficulty on the n-SiC side and may practically be considered as an ohmic junction. However, a high Schottky barrier is anticipated for a p-SiC/metal junction. This is because SiC has a large bandgap. According to the first embodiment, however, an increasing energy gain due to the transfer of electrons is considered for an interface with an increasing Schottky barrier expected, which makes the first embodiment more advantageous. A wide gap semiconductor can demonstrate effects particularly thanks to the energy gain.

Figures 4A, 4B:
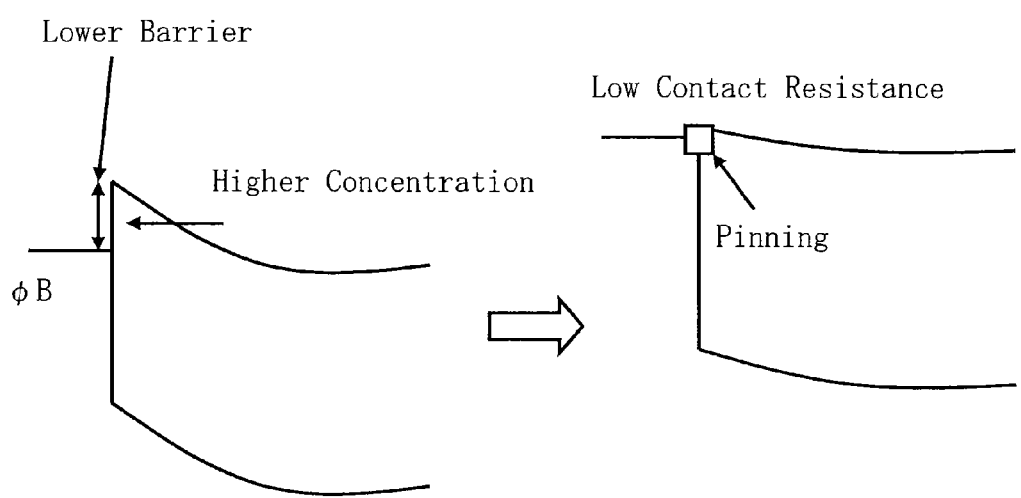
FIGS. 4A and 4B are conceptual diagrams for explaining a pinning effect according to the first embodiment compared with a conventional example.

The pinning effect in the first embodiment will be described by comparing with a conventional example using FIGS. 4A and 4B. FIG. 4A shows a case when the above pinning material like in the first embodiment is not used. In FIG. 4A, a lower barrier is attempted to realize by implanting the dopant in high concentrations and using high-temperature annealing for activation. The selection of electrode material is also important. In the first embodiment, by contrast, as shown in FIG. 4B, a pinning material is introduced to an interface between SiC and metal. Accordingly, an interface state can be created at a band end. An almost zero barrier can be realized by the effect of such a pinning material. Further, the flexibility of metal selection can dramatically be increased. Further, the need for annealing at a high temperature can be eliminated so that device deterioration can be avoided or controlled. Moreover, the pinning material can be applied to n-type and p-type SiC simultaneously.

As described above, by causing an interface portion with an electrode to contain a pinning material for each of n-type SiC and p-type SiC in such a way that the surface density thereof peaks, the resistance of each of n-type and p-type can be reduced. Further, an electrode of one type of metal can be formed simultaneously on the n-type ($n^+$) SiC semiconductor region 230 and the p-type ($p^+$) SiC semiconductor region 220. In the first embodiment, the reduction of resistance in the junction between the n-type ($n^+$) SiC semiconductor region 230 and the electrode 240 to be a source electrode, the reduction of resistance in the junction between the p-type ($p^+$) SiC semiconductor region 220 and the electrode 240 to be a source electrode, and the reduction of resistance in the junction between the back side of the ($n^+$) SiC semiconductor substrate 200 and the electrode 262 to be a drain electrode can all be realized. However, the first embodiment is not limited to this and a configuration to realize only one or any two of the reduction of resistance in the junction between the n-type ($n^+$) SiC semiconductor region 230 and the electrode 240 to be a source electrode, the reduction of resistance in the junction between the p-type ($p^+$) SiC semiconductor region 220 and the electrode 240 to be a source electrode, and the reduction of resistance in the junction between the back side of the ($n^+$) SiC semiconductor substrate 200 and the electrode 262 to be a drain electrode may be adopted.

With further micropatterning in the future, it will be necessary to make contact with both of an n-type SiC region and a p-type SiC region within the same SiC single element by the same metal. If both the n-type SiC region and the p-type SiC region should be contacted by the same metal, simultaneous and low-resistance contact formation is desirable from the perspective of limitations of adjustment precision and simplification of processes. In other words, a technology to make low-resistance contact with both the n-type SiC region and the p-type SiC region by one electrode is desirable. If such a reduction of resistance cannot be realized, the ON resistance will be large in the n-type SiC region. On the other hand, a resistor and a capacitor are effectively formed in the p-type SiC region and thus, a problem of switching speed is caused. If contact resistance to the p-type SiC region is large, the RC time constant when an element is driven increases, which slows down the operation speed. According to the first embodiment, these problems are tackled by making contact with both the n-type SiC region and the p-type SiC region by the same metal. Further, low-resistance contact can be formed simultaneously. Therefore, the ON resistance can be reduced in the n-type SiC region. On the other hand, the switching speed can be increased in the p-type SiC region.

Figure 5:
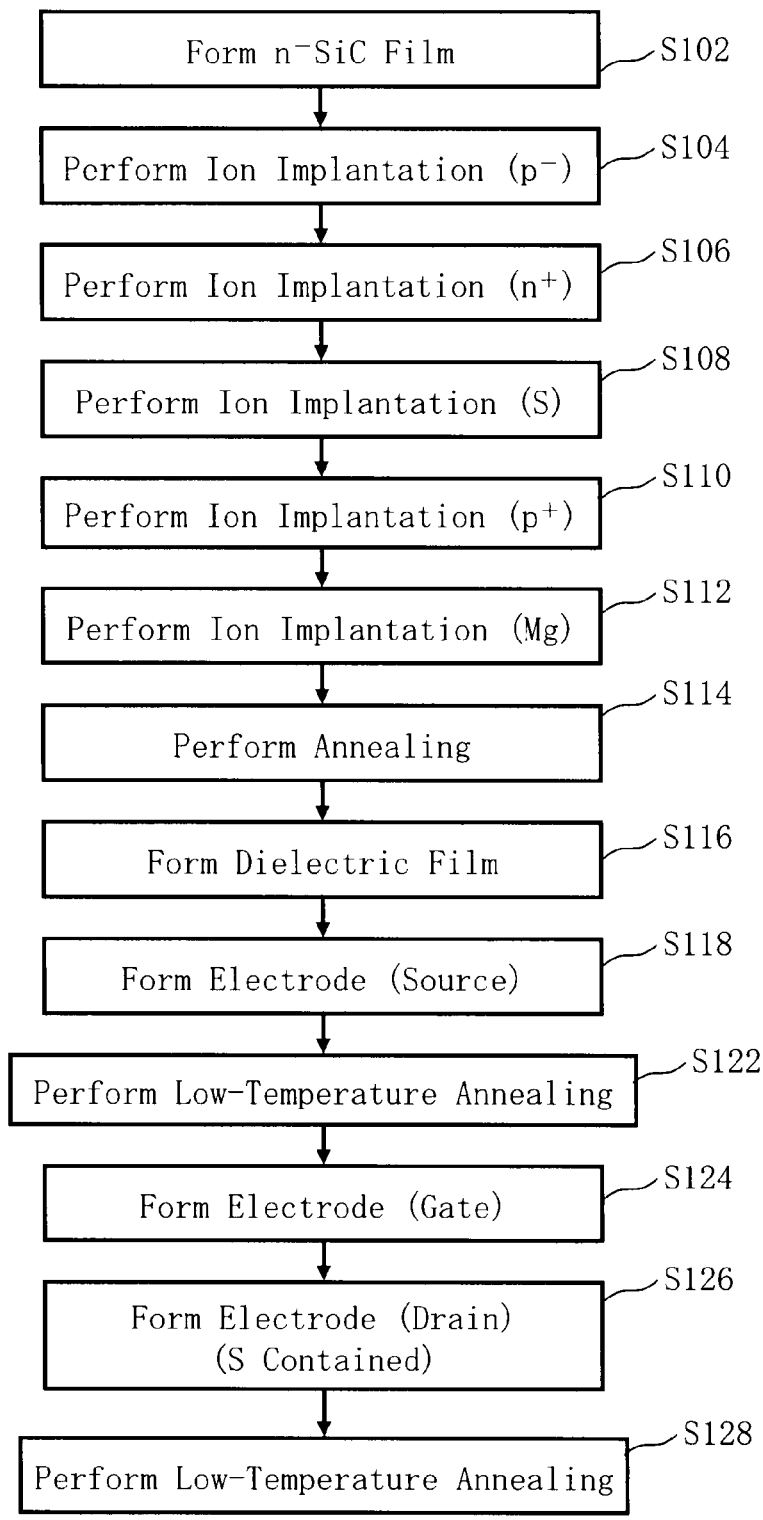
FIG. 5 is a flowchart showing principal processes of a method for fabricating the semiconductor device according to the first embodiment.

The flowchart showing principal processes of a method for fabricating the semiconductor device according to the first embodiment is shown FIG. 5. In FIG. 5, the method for fabricating the semiconductor device undergoes a series of processes including an ($n^-$) SiC film formation process (S102), ion implantation process for ($p^-$) (S104), ion implantation process for ($n^+$) (S106), ion implantation process of a pinning material (S) (S108), ion implantation process for ($p^+$) (S110), ion implantation process of a pinning material (Mg) (S112), annealing process (S114), dielectric film formation process (S116), electrode (source electrode) formation process (S118), low-temperature annealing process (S122), electrode (gate electrode) formation process (S124), electrode (drain electrode) formation process (S126), and low-temperature annealing process (S128).

Process sectional views showing processes undergone corresponding to the flowchart of the method for fabricating the semiconductor device according to the first embodiment are shown in FIGS. 6A to 6D. In FIGS. 6A to 6D, the ($n^-$) SiC film formation process (S102) to the ion implantation process (S112) in FIG. 5 are shown. Subsequent processes will be described later.

In FIG. 6A, as the ($n^-$) SiC film formation process (S102), the ($n^-$) SiC semiconductor layer 202 is formed on the surface of the ($n^+$) SiC semiconductor substrate 200. As the ($n^+$) SiC semiconductor substrate 200, for example, a solid single crystal SiC substrate is used. The impurity concentration (doping concentration) inside the ($n^+$) SiC semiconductor substrate 200 of $1 \times 10^{16}$ atoms/cm$^3$ or more and less than $1 \times 10^{20}$ atoms/cm$^3$ is suitable. Here, the ($n^+$) SiC semiconductor substrate 200 formed with the impurity concentration of $6 \times 10^{17}$ atoms/cm$^3$ is used. If not specifically mentioned, the substrate of $6 \times 10^{17}$ atoms/cm$^3$ as the substrate concentration is used also in subsequent embodiments regardless of the p-type or n-type. As the ($n^+$) SiC semiconductor substrate 200, a hexagonal SiC substrate (4H—SiC substrate) of (0001) plane is suitable. The ($n^-$) SiC semiconductor layer 202 is formed with an ($n^-$) SiC film being epitaxially grown on the surface of the ($n^+$) SiC semiconductor substrate 200 by the epitaxial chemical vapor deposition. When an epitaxial layer is formed, for example, an SiH$_4$ gas or C$_3$H$_8$ gas may be used as a material gas. Nitrogen or P may be used as the impurity (dopant). The ($n^-$) SiC semiconductor layer 202 becomes a withstand voltage holding layer. The ($n^-$) SiC semiconductor layer 202 suitably has, for example, 0.5 μm or more and 20 μm or less as the film thickness. Here, the ($n^-$) SiC semiconductor layer 202 is formed to a thickness of, for example, 10 μm. The impurity concentration (doping concentration) inside the ($n^-$) SiC semiconductor layer 202 of $8 \times 10^{14}$ atoms/cm$^3$ or more and less than $3 \times 10^{17}$ atoms/cm$^3$ is suitable. Here, the ($n^-$) SiC semiconductor layer 202 formed with the impurity concentration of $5\times10^{15}$ atoms/cm$^3$ is used. If not specifically mentioned, $5\times10^{15}$ atoms/cm$^3$ is used also in subsequent embodiments as the concentration of (n⁻) SiC.

In FIG. 6B, as the ion implantation process for (p⁻) (S104), the (p⁻) SiC semiconductor region 210 (the first SiC semiconductor region or third SiC semiconductor part) is formed by selectively implanting impurities whose conduction type is p-type in the (n⁻) SiC semiconductor layer 202 using an oxide film formed by using photolithography and etching as a mask. The concentration of conductive impurities in the (p⁻) SiC semiconductor region 210 can be set to, for example, $1\times10^{16}$/cm$^3$. If not specifically mentioned, the substrate of $1\times10^{16}$ atoms/cm$^3$ is used also in subsequent embodiments as the concentration of (p⁻) SiC. For example, $1\times10^{15}$/cm$^2$ and 80 KeV can be set as conditions for implantation of Al ions to be impurities of p-type. Here, the substrate is heated to, for example, 300° C. The concentration of conductive impurities in the (p⁻) SiC semiconductor region 210 is suitably $1\times10^{13}$/cm$^3$ or more and $5\times10^{17}$/cm$^3$ or less. The concentration of conductive impurities in the (p⁻) SiC semiconductor region 210 is preferably $1\times10^{15}$/cm$^3$ or more and $5\times10^{16}$/cm$^3$ or less.

In FIG. 6C, as the ion implantation process for (n⁺) (S106), the (n⁺) SiC semiconductor region 230 (the second SiC semiconductor region or second SiC semiconductor part) is formed by selectively implanting n-type conductive impurities into a portion of the surface of the (p⁻) SiC semiconductor region 210.

Figure 7A:
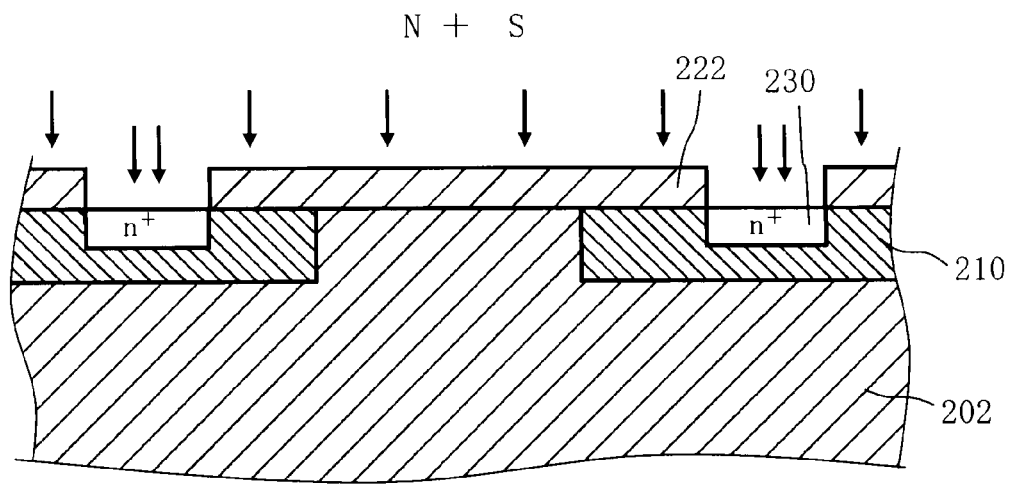
FIGS. 7A and 7B are process sectional views for explaining the method of co-doping according to the first embodiment.
Figure 7B:
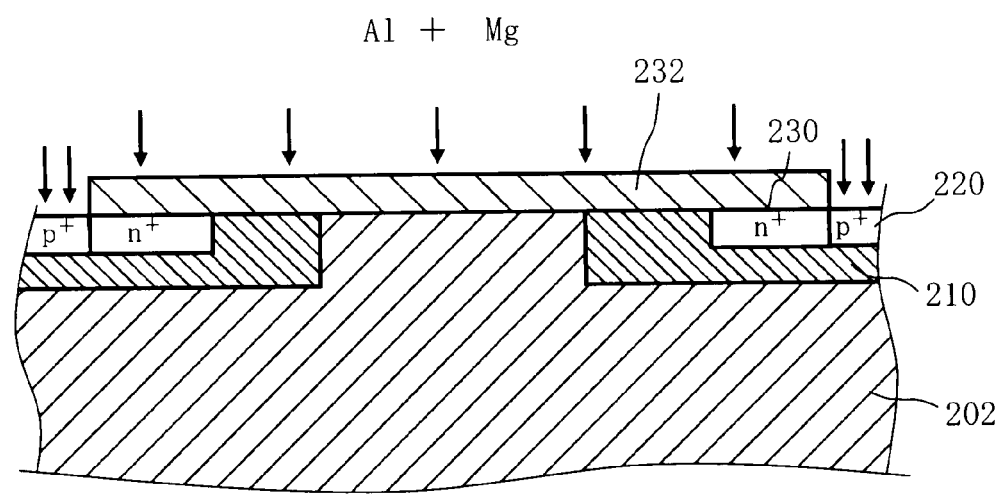

The method of co-doping in the first embodiment will be described using FIGS. 7A and 7B. After the mask of the oxide film used for forming the (p⁻) SiC semiconductor regions 210 is removed, as shown in FIG. 7A, a mask 222 of the oxide film having a new pattern is formed again using photolithography and etching. Then, the (n⁺) SiC semiconductor region 230 is formed by implanting n-type conductive impurities through an opening of the new mask 222. The concentration of conductive impurities in the (n⁺) SiC semiconductor region 230 can be set to, for example, $5\times10^{16}$/cm$^3$. If not specifically mentioned, $5\times10^{16}$ atoms/cm$^3$ is used also in subsequent embodiments as the concentration of (n⁺) SiC. For example, $1\times10^{15}$/cm$^2$ and 40 KeV can be set as conditions for implantation of N ions to be impurities of n-type. Here, the substrate is heated to 300° C. The concentration of conductive impurities in the (n⁺) SiC semiconductor region 230 is suitably $1\times10^{14}$/cm$^3$ or more and $1\times10^{18}$/cm$^3$ or less. The concentration of conductive impurities in the (n⁺) SiC semiconductor region 230 is preferably $5\times10^{15}$/cm$^3$ or more and $5\times10^{17}$/cm$^3$ or less.

Then, as the ion implantation process of n-type pinning material (S) (S108), immediately after introduction of N ions, S ions serving as an n-type pinning material are implanted in the (n⁺) SiC semiconductor region 230 by using the same mask 222. The concentration of S can be set to, for example, $1\times10^{15}$/cm$^3$. For example, $1\times10^{14}$/cm$^2$ and 20 KeV can be set as conditions for implantation of S ions. Here, the substrate is heated to 300° C. while retaining the state of introduction of N ions. S in the (n⁺) SiC semiconductor region 230 is concentrated (piled up) in the interface due to annealing after electrode formation and the surface density in the interface can be set to $1\times10^{12}$/cm$^2$ or more and $1\times10^{15}$/cm$^2$ or less. In the present embodiment, the surface density is about $2\times10^{13}$/cm$^2$.

The amount of "pinning material" will briefly be considered. The lower limit thereof is determined by the necessary voltage shift amount in the interface. The amount of n-type is about 0.1 eV (to change the work function of metal of 4.3 eV or more to an effective work function smaller than 4.2 eV) and the amount of p-type is about 1.7 eV (to change the work function of metal of only 5.7 eV or less to an effective work function larger than 7.4 eV).

The shift X (V) by a fixed polarization amount constituted of the metal/SiC substrate interface can be calculated as X=(charge)×(surface density)×(polarization length)/dielectric constant. More specifically, X (V)=(charge)×(surface density)×(polarization length)/dielectric constant=(charge $2\times1.602\times10^{-19}$ C)×(surface density cm$^{-2}$)×(polarization length×$10^{-8}$ cm)/(relative dielectric constant ∈)/[$8.854\times10^{-12}$ (fard/m)]=$1.81\times10^{-14}$ (number surface density: cm$^{-2}$ unit)×(polarization length: Å unit)/(relative dielectric constant). For S, Se, Te or Mg, Ca, Sr, Ba in the SiC substrate, the charge is 2, the number surface density is about $10^{13}$ cm$^{-2}$, and the dielectric constant is 10. Because the lower limit is considered, the maximum value is adopted and about 10 Å is assumed for the polarization length. Thus, X=$1.81\times10^{-14}\times2\times10^{13}\times10/10$=0.36 (V). The voltage shift amount for n-type should be about 0.1 V and thus, the surface density of $0.28\times10^{13}$ cm$^{-2}$ or more is needed. The voltage shift amount for p-type should be about 1.7 V and thus, the surface density of $4.7\times10^{13}$ cm$^{-2}$ or more is needed. If the surface density is less than these values, the necessary shift amount is not obtained and the resistance increases.

The upper limit is a state in which Si is replaced by the "pinning material". The surface density of the "pinning material" in this case is calculated as 1 atom÷unit cell area=1÷(lattice constant a×lattice constant a×√3÷2)=$1.22\times10^{15}$ cm$^{-2}$. However, the amount of additives in the interface should be as less as possible. If there is an extra amount of additives, the number of defects may increase on the substrate side, leading to higher resistance. Particularly on the electrode side, the resistance increases with an increasing amount of impurities, which does not pay.

The upper limit is determined from the above formula. Because the upper limit is determined, the minimum value is adopted and about 1 Å is assumed for the polarization length. 1.5 eV or less (to change the work function of 5.7 eV to an effective work function of less than 4.2 eV) is enough as the shift amount in the interface for n-type and thus, the surface density may be $4.2\times10^{14}$ cm$^{-2}$ or less. 3.1 eV or less (to change the work function of 4.3 eV to an effective work function of more than 7.4 eV) is enough as the shift amount in the interface for p-type and thus, the surface density may be $8.7\times10^{14}$ cm$^{-2}$ or less. The upper limit shown here is determined by assuming that the polarization length is about 1 Å, but may be increased up to 10 Å. Thus, 1/10 of the surface density may be considered to be enough. The surface density should be as low as possible and thus, the surface density for n-type may be $4.2\times10^{13}$ cm$^{-2}$ or less. For p-type, $8.7\times10^{13}$ cm$^{-2}$ or less may be enough.

To sum up, for n-type, the surface density is $0.28\times10^{13}$ cm$^{-2}$ or more and $1.22\times10^{15}$ cm$^{-2}$ or less. Preferably, the surface density is $0.28\times10^{13}$ cm$^{-2}$ or more and $4.2\times10^{14}$ cm$^{-2}$ or less. Particularly preferably, the surface density is $0.28\times10^{13}$ cm$^{-2}$ or more and $4.2\times10^{13}$ cm$^{-2}$ or less.

For p-type, the surface density is $4.7\times10^{13}$ cm$^{-2}$ or more and $1.22\times10^{15}$ cm$^{-2}$ or less. Preferably, the surface density is $4.7\times10^{13}$ cm$^{-2}$ or more and $8.7\times10^{14}$ cm$^{-2}$ or less. Particularly preferably, the surface density is $4.7\times10^{13}$ cm$^{-2}$ or more and $8.7\times10^{13}$ cm$^{-2}$ or less.

In FIG. 6D, as the ion implantation process for (p⁺) (S110), the (p⁺) SiC semiconductor region 220 (the third SiC semiconductor region or first SiC semiconductor part) is formed by selectively implanting p-type conductive impurities in another portion of the surface of the (p⁻) SiC semiconductor regions 210 so as to be adjacent to the (n⁺) SiC semiconductor region 230. After the mask 222 of the oxide film used for forming the (n+) SiC semiconductor region 230 is removed, as shown in FIG. 7B, a mask 232 of the oxide film having a new pattern is formed again using photolithography and etching. Then, the (p+) SiC semiconductor region 220 is formed by implanting p-type conductive impurities through an opening of the new mask 232. The concentration of conductive impurities in the (p+) SiC semiconductor region 220 can be set to, for example, $5 \times 10^{16}/cm^2$. For example, $1 \times 10^{15}/cm^2$ and 40 KeV can be set as conditions for implantation of Al ions to be impurities of p-type. Here, the substrate is heated to 300° C. The concentration of conductive impurities in the (p+) SiC semiconductor region 220 is suitably $1 \times 10^{14}/cm^2$ or more and $1 \times 10^{18}/cm^2$ or less. The concentration of conductive impurities in the (p+) SiC semiconductor region 220 is preferably $5 \times 10^{15}/cm^2$ or more and $5 \times 10^{17}/cm^2$ or less.

Then, as the ion implantation process of p-type pinning material (Mg) (S112), immediately after introduction of Al ions, Mg ions are implanted in the (p+) SiC semiconductor region 220 by using the same mask 232. The concentration of Mg can be set to, for example, $1 \times 10^{15}/cm^3$. Here, the substrate is heated to 300° C. while retaining the state of introduction of Al ions. For example, $1 \times 10^{14}/cm^2$ and 20 KeV can be set as conditions for implantation of Mg ions. Mg in the (p+) SiC semiconductor region 220 is piled up in the interface due to annealing after electrode formation and the surface density in the interface can be set to $1 \times 10^{12}/cm^2$ or more and $1 \times 10^{15}/cm^2$ or less. In the present embodiment, the surface density is about $8 \times 10^{13}/cm^2$.

As the annealing process (S114), activation annealing is performed after the above implantation process. For the activation annealing, conditions such as the heating temperature of 1600° C. and the heating time of 30 min by using an argon (Ar) gas as an atmospheric gas can be used. In this manner, a structure shown in FIG. 6D is obtained. At this point, while, activation of the dopant introduced into SiC can be realized, the dopant is hardly diffused. Also, introduced S and Mg are hardly diffused. This point has been checked to apply when, in addition to S and Mg, other pinning materials such as Se, Te, Ca, Sr, and Ba are introduced. Thus, the SiC material is fundamentally different from Si in that "the dopant and other elements are hardly diffused in SiC". If many dopants and S or Mg should be implanted into Si, dopants and S or Mg are diffused. Such a difference arises because the lattice spacing of Si—C is small and thus, compared with Si, the diffusion is limited.

Figure 8A:
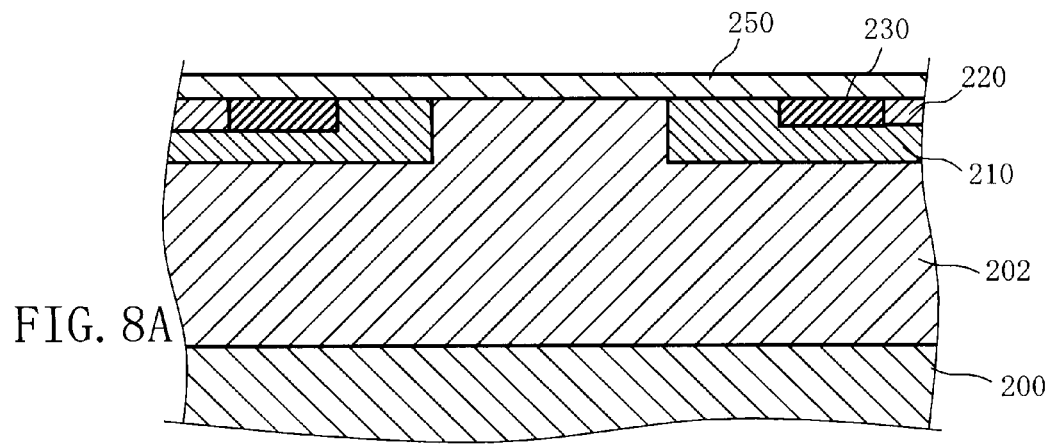
FIGS. 8A to 8C are process sectional views showing processes undergone corresponding to the flowchart of the method for fabricating the semiconductor device according to the first embodiment.
Figure 8B:
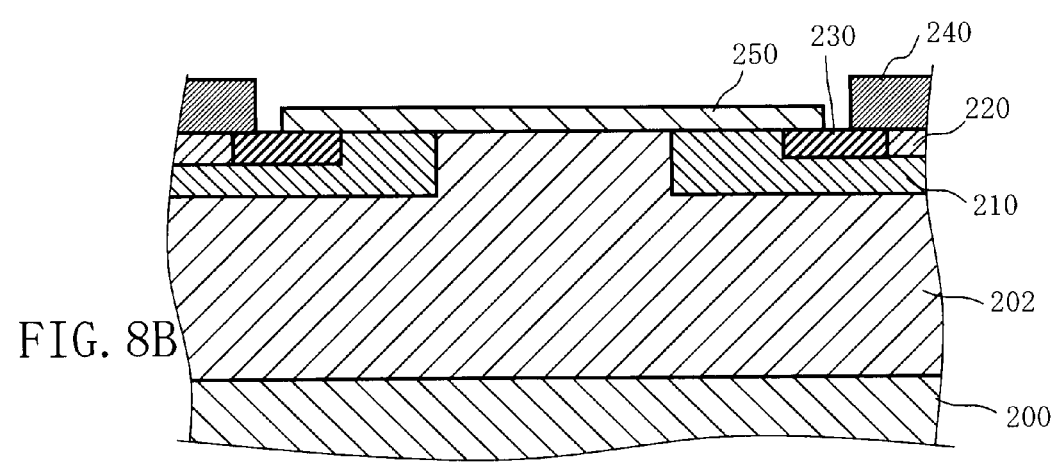
Figure 8C:
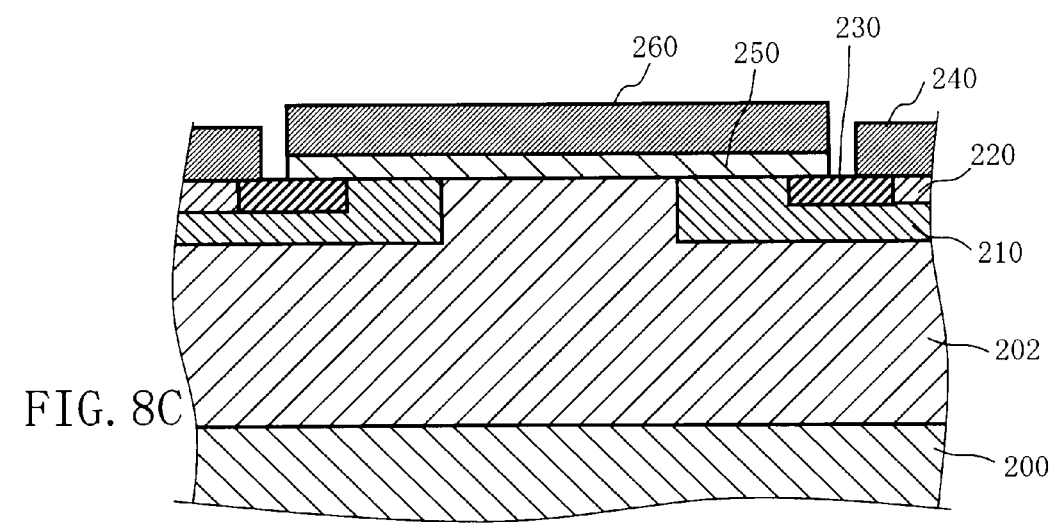

Process sectional views showing processes undergone corresponding to the flowchart of the method for fabricating the semiconductor device according to the first embodiment are shown in FIGS. 8A to 8C. In FIGS. 8A to 8C, the dielectric film formation process (S116) to the electrode (gate electrode) formation process (S124) in FIG. 5 are shown. Subsequent processes will be described later.

In FIG. 8A, as the dielectric film formation process (S116), the oxide film 250 is formed so as to cover the whole of the (n−) SiC semiconductor layer 202, the (p−) SiC semiconductor regions 210, the (p+) SiC semiconductor region 220, and the (n+) SiC semiconductor region 230. For example, dry oxidation (thermal oxidation) may be used as the formation method of the oxide film 250. For example, a compact oxide film can be produced by dry oxidation under conditions of 1200° C. and the heating time of 30 min.

Next, in FIG. 8B, a resist film having a pattern is first formed on the oxide film 250 by using photolithography. The resist film is used as a mask to remove a portion of the oxide film 250 positioned on the surface of the (p+) SiC semiconductor region 220 and a portion of the surface of the (n+) SiC semiconductor region 230 by etching. Accordingly, the oxide film 250 extending over the (n+) SiC semiconductor regions 230 on both sides is formed.

Subsequently, as the electrode (source electrode) formation process (S118), a conductive film of metal or the like is formed on the surface of the (p+) SiC semiconductor region 220 and a portion of the surface of the (n+) SiC semiconductor region 230 exposed by an opening formed after the resist film and the oxide film 250 are removed. The conductive film becomes the electrode 240 (first electrode). Then, the resist film is removed to remove (lift-off) the conductive film positioned on the resist film. If the width of the oxide film 250 is made narrower by etchback or the like, a gap can be formed between the oxide film 250 and the electrode 240 to avoid contact therebetween.

For example, nickel (Ni), tungsten (W), and titanium nitride (TiN) are suitable as an electric conductor to be the electrode 240. W and TiN are advantageously easy to work on. The type and production process have severely been limited for this electrode. However, it turns out that no limitation is imposed if the conductor is stable because the effective work function is pinned to about 4.2 eV in the n+ region by the next heat treatment and about 7.2 eV in the p+ region. Thus, for example, other metals or materials other than metals superior in workability such as n-type (such as phosphorus doped) polysilicon, p-type (such as boron doped) polysilicon (poly-Si), n-type (such as nitrogen or phosphorus doped) polysilicon carbide, and p-type (such as boron or Al doped) polysilicon carbide (poly-SiC) may be used. Si and SiC are materials constituting an SiC substrate and thus very compatible with the substrate. If the method of the present patent is used, limitations of the work function of an electrode and the like are completely eliminated and thus, a free selection can be made thanks to stability, workability, resistance, easy production, and compatibility with the substrate.

As the low-temperature annealing process (S122), heat treatment at 400° C. is provided after the source electrode is produced. For example, the heat treatment is to heat for 5 min in an argon (Ar) gas. With the heat treatment, S can be aggregated (piled up) in the interface between the electrode 240 and the (n+) SiC semiconductor region 230 and Mg in the interface between the electrode 240 and the (p+) SiC semiconductor region 220. This is because the states of S and Mg are stabilized by piling up in the interface through exchange of electrons with the electrode. If annealing is performed at high temperature (for example, 1700° C.) as in the past after the oxide film 250 to be a gate oxide film being formed, the interface between the oxide film 250 and the channel region is caused to deteriorate. In the present embodiment, however, the heating temperature can significantly be lowered to 400° C. so that such deterioration can be controlled. In the lower temperature of 300° C. or below, the heating treatment time will be longer. With an increasing temperature, on the other hand, a treatment time will be needed to raise/lower the temperature before/after the heat treatment. Considering these factors collectively, 300° C. to 400° C. can be deemed to be appropriate. Considering the total treatment time, the temperature around 400° C. can be deemed to be best. At this temperature, a reaction between SiC and metal does not occur. Also in this sense, the temperature around 400° C. can be said to be an appropriate temperature. If silicide obtained by a reaction between SiC and metal should be used as an electrode, after the silicide is produced at high temperature, an interface pileup process may be introduced by low-temperature annealing of the present patent.

In FIG. 8C, as the electrode (gate electrode) formation process (S124), the electrode 260 (second electrode) to be a gate electrode is formed on the oxide film 250 as a gate dielectric film. For example, n-type polysilicon may be used. n-type polysilicon may also be used for the source electrode so that an Ni film is further formed for both the source electrode and gate electrode and heat treatment is provided to create a silicide film of NiSi as an electrode (for example, annealing in Ar at 500° C. for 30 s).

Figure 9:
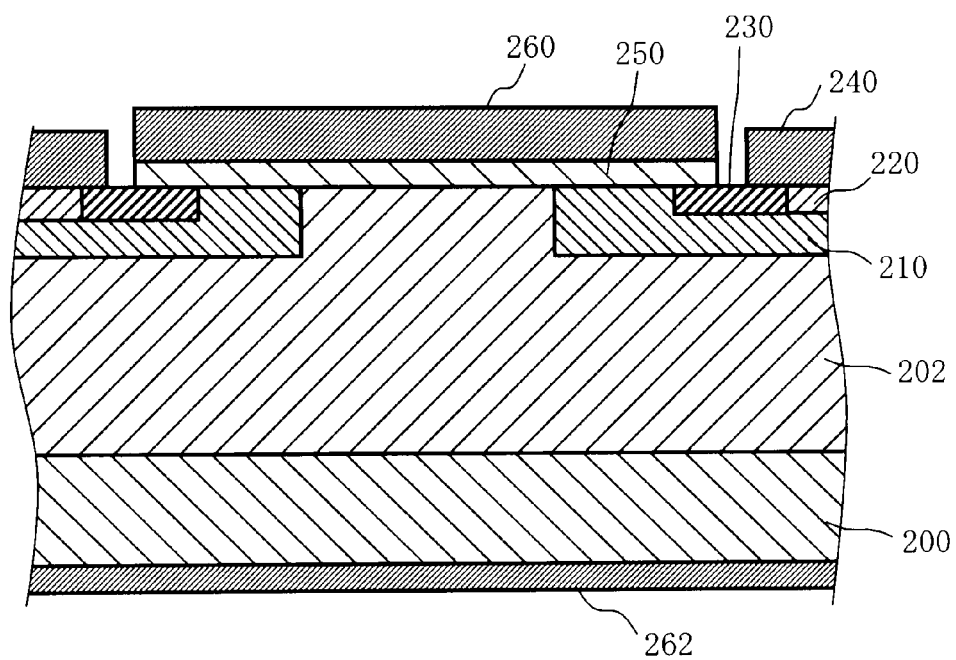
FIG. 9 a process sectional view showing a process undergone corresponding to the flowchart of the method for fabricating the semiconductor device according to the first embodiment.

A process sectional view showing a process undergone corresponding to the flowchart of the method for fabricating the semiconductor device according to the first embodiment is shown in FIG. 9. In FIG. 9, the electrode (drain electrode) formation process (S126) and the low-temperature annealing process (S128) in FIG. 5 are shown.

As the electrode (drain electrode) formation process (S126), the electrode 262 to be a drain electrode is formed on the back side of the (n$^+$) SiC semiconductor substrate 200. If a conventional electrode configuration, for example, an Ni electrode is used for the back side electrode, a high-temperature process of higher than 800° C. will be needed. Thus, in the first embodiment, S to be a pinning material to the interface is also used here.

Figure 10:
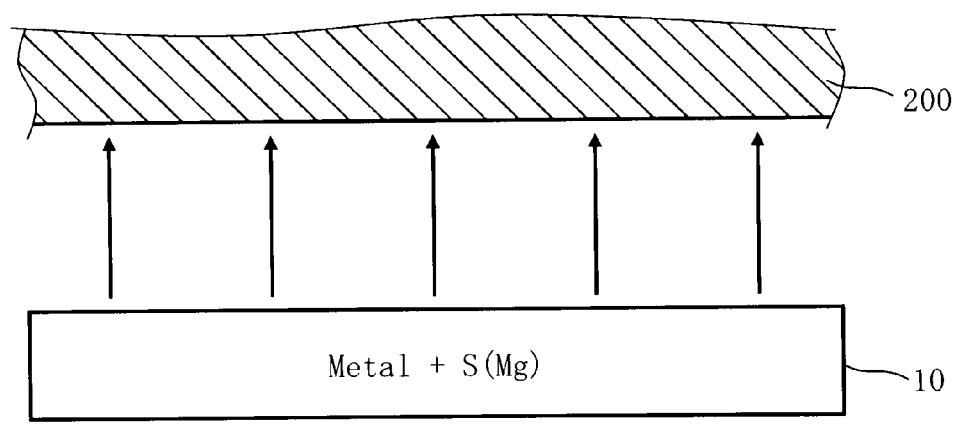
FIG. 10 is a conceptual diagram for explaining another example of the method of doping a pinning material according to the first embodiment.

Another example of the method of doping a pinning material in the first embodiment will be described using FIG. 10. The sputter process can be used as a method of implanting S as an n-type pinning material. That is, the electrode 262 (an example of the third electrode or an example of the second electrode) is formed by forming a conductive film on the back side of the (n$^+$) SiC semiconductor substrate 200 by the sputter process using a target 10 in which S is mixed in Ni to be an electrode material by 1 atomic percentage. For example, an NiSi electrode is formed by performing annealing in Ar at 500° C. for 30 s.

Then, as the low-temperature annealing process (S128), heat treatment at 400° C. is provided. For example, the heat treatment is to heat for 5 min in an argon (Ar) gas. With the heat treatment, S can be aggregated (piled up) in the interface between the electrode 262 and the (n$^+$) SiC semiconductor substrate 200. In this case, while thin NiSi is formed near the interface, S is piled up in the interface with SiC and the effective work function becomes 4.2 eV so that an ohmic connection can be established.

Figure 11A:
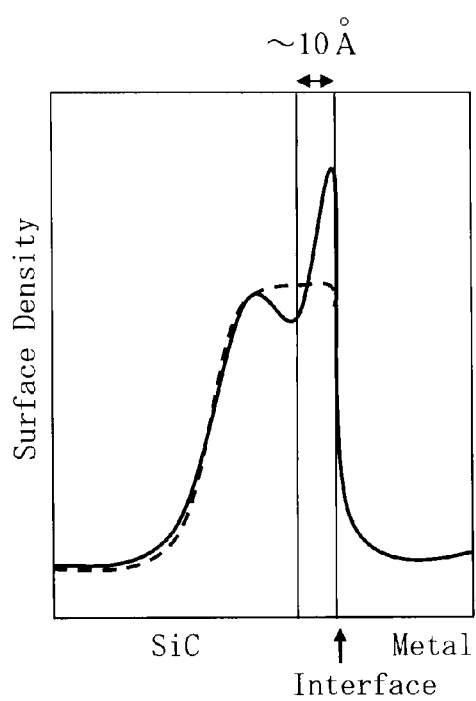
FIGS. 11A and 11B are graphs showing an example of a surface density of the pinning material according to the first embodiment.
Figure 11B:
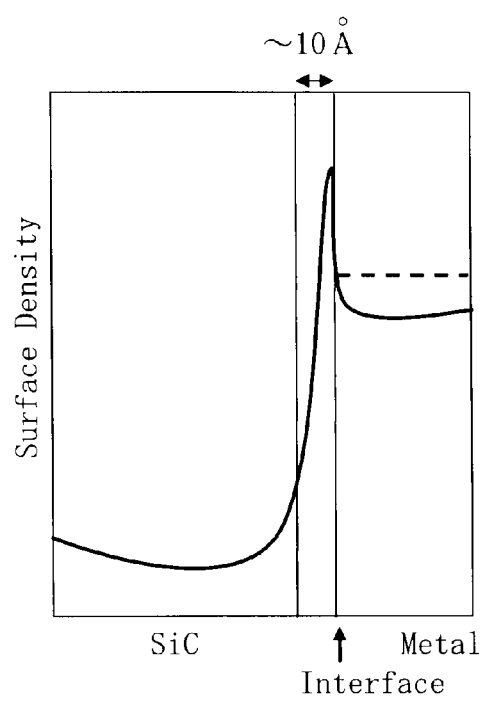

Graphs in FIGS. 11A and 11B show an example of the surface density of a pinning material according to the first embodiment. The vertical axis denotes the surface density and the horizontal axis denotes the position. In FIG. 11A, an example of the surface density of a pinning material when the dopant and the pinning material are co-doped. In other words, FIG. 11A shows a case when the pinning material is implanted to the SiC side and then, an electrode of a metallic material is formed. In an (n$^+$) SiC semiconductor, for example, a case when S to be an n-type pinning material is implanted is shown. This also applies when Se or Te is implanted. The trend of the graph is the same when Mg, Ca, Sr, or Ba to be a p-type pinning material is implanted into a (p$^+$) SiC semiconductor. As indicated by a dotted line in FIG. 11A, though the surface side of SiC is highly concentrated before annealing even if a metallic film is formed, there is no peak that stands out. In contrast, if annealing is performed, it is evident that a peak of S (or another "pinning material") appears in the interface portion of SiC with the metal, here within 10 Å from the surface of SiC due to pileup in the interface. The mechanism by which a peak is formed is stabilization by electron transfer. Electrons can be transferred within 10 Å and thus, a peak is formed within this range. This process is characterized by high-efficiency activation due to an effect of co-doping. Moreover, the amount of impurities on the metal side is small and thus, the resistance on the metal side can be maintained low. That is, not only the reduction of contact resistance, but also the reduction of resistance on the substrate side and the metal side is achieved. The effect of co-doping can further be enhanced by further introducing a large amount of the "pinning material". Accordingly, achieving almost 100% of the activation ratio at the operating temperature, that is, the reduction of resistance in the substrate portion is also possible. In the present embodiment, the amount of the "pinning material" is intentionally reduced to demonstrate only the pinning effect. Thus, though improvement in activation ratio of about 10% is observed, it is easy to make further improvement. This process uses two properties: the "pinning material" (such as S and Mg) is not diffused by activation annealing and pileup in the interface by low-temperature annealing after electrode formation. The first property is caused by a small lattice constant. The second property is caused by a large gap.

In FIG. 11B, an example of the surface density of the pinning material when sputtered by using an electrode material containing S (similarly for Se or Te) as a target is shown. As indicated by a dotted line in FIG. 11B, S is present in the metallic film in almost the same concentrations before annealing is performed after formation of the metallic film. In contrast, if annealing is performed, it is evident that S moves from the metal side to the SiC side to pile up in the interface and a peak of S appears in the interface portion of SiC with the metal, here within 10 Å. The trend of the graph is the same when Mg, Ca, Sr, or Ba to be a p-type pinning material is implanted into a (p$^+$) SiC semiconductor. In this case, the pinning material is hardly diffused into the substrate. Therefore, an effect of co-doping cannot be demonstrated. Moreover, a large amount of impurities is implanted to the metal side and thus, a higher resistance of the metal is unavoidable. That is, the process in FIG. 11A is superior in terms of properties. However, the process in FIG. 11B is very simple and superior in cost.

As the (n$^+$) SiC semiconductor substrate 200, for example, a 4H—SiC substrate having another plane such as the (000-1) plane as the main surface. That is, the ohmic connection due to pileup of S (or Se or Te) in the interface between the source electrode and n+ region and the ohmic connection due to pileup of Mg (or Ca, Sr, or Ba) in the interface between the source electrode and p+ region are valid regardless of the orientation of the substrate. That is, that an electron state of sulfur (or selenium or tellurium) creates a localized state near the bottom of the conduction band is a nature as a bulk. Also, that an electron state of Mg (or calcium, strontium, or barium) creates a localized state near the top of the valence band is a nature as a bulk.

In the first embodiment, the ohmic connection is obtained by pileup of S at low temperature in the source electrode/n+ region interface or pileup of Mg at low temperature in the source electrode/p+ region interface. If, instead of S, Se or Te is introduced, a similar result is obtained. If, instead of Mg, Ca, Sr, or Ba is introduced, a similar result is obtained. As a result, (1) it turns out that the ON resistance in the source electrode/n+ region interface can be reduced immeasurably compared with the past. While $1\times10^{-5}$ Ωcm$^2$ or less is aimed for as the contact resistance, $1\times10^{-7}$ Ωcm$^2$ is realizable. (2) It turns out that the contact resistance in the source electrode/p+ region interface can be reduced immeasurably compared with the past. While $1\times10^{-3}$ Ωcm$^2$ or less is aimed for as the contact resistance, $1\times10^{-6}$ Ωcm$^2$ is realizable. (3) In the conventional configuration, the source electrode and the n+ region or p+ region are contacted by forming an interface reaction later at a high temperature. It is known that if a high-temperature heating process is undergone after a gate dielectric film is formed, a large amount of dangling bond of the SiO$_2$/SiC substrate interface arises so that mobility deteriorates significantly. In the present embodiment, however, only low-temperature annealing for the purpose of piling up additive materials at low temperature is performed. As a result, it turns out that the channel mobility has a value (the peak value of 320 cm$^2$/Vs after passing through processes in the present embodiment), which is larger than a conventional value (the peak value of 20 cm$^2$/Vs after passing through the high-temperature heating process) by an order of magnitude. The improvement in mobility directly affects the ON resistance and thus very effective for device characteristic improvement. (4) The electrode is changed like the TiN electrode, polysilicon electrode, and W electrode, but no significant difference is found. However, if S or Mg is not introduced, electrode dependence appears intensely.

According to the first embodiment, as described above, ohmic connection can be established for both the source electrode and the drain electrode. Thus, low-resistance contact between a p-type SiC region and metal can be made realizable. Also, low-resistance contact between an n-type SiC region and metal at low temperature can be made realizable. Further, one electrode can be connected to the p-type SiC region and the n-type SiC region simultaneously.

It is also possible to create only one of ohmic connection between an n region and metal and ohmic connection between a p region and metal. If, for example, ohmic connection is established between the n region and Ni, Mg may be introduced into the p region only simultaneously with Al introduction.

Second Embodiment

In the first embodiment, a case when the dopant and pinning material are co-doped for forming the (n$^+$) SiC semiconductor region 230 has been described. Similarly, a case when the dopant and pinning material are co-doped for forming the (p$^+$) SiC semiconductor region 220 has been described. In the second embodiment, the method of introducing the pinning material into the (n$^+$) SiC semiconductor region 230 and the (p$^+$) SiC semiconductor region 220 by using the sputter process will be described.

Figure 12:
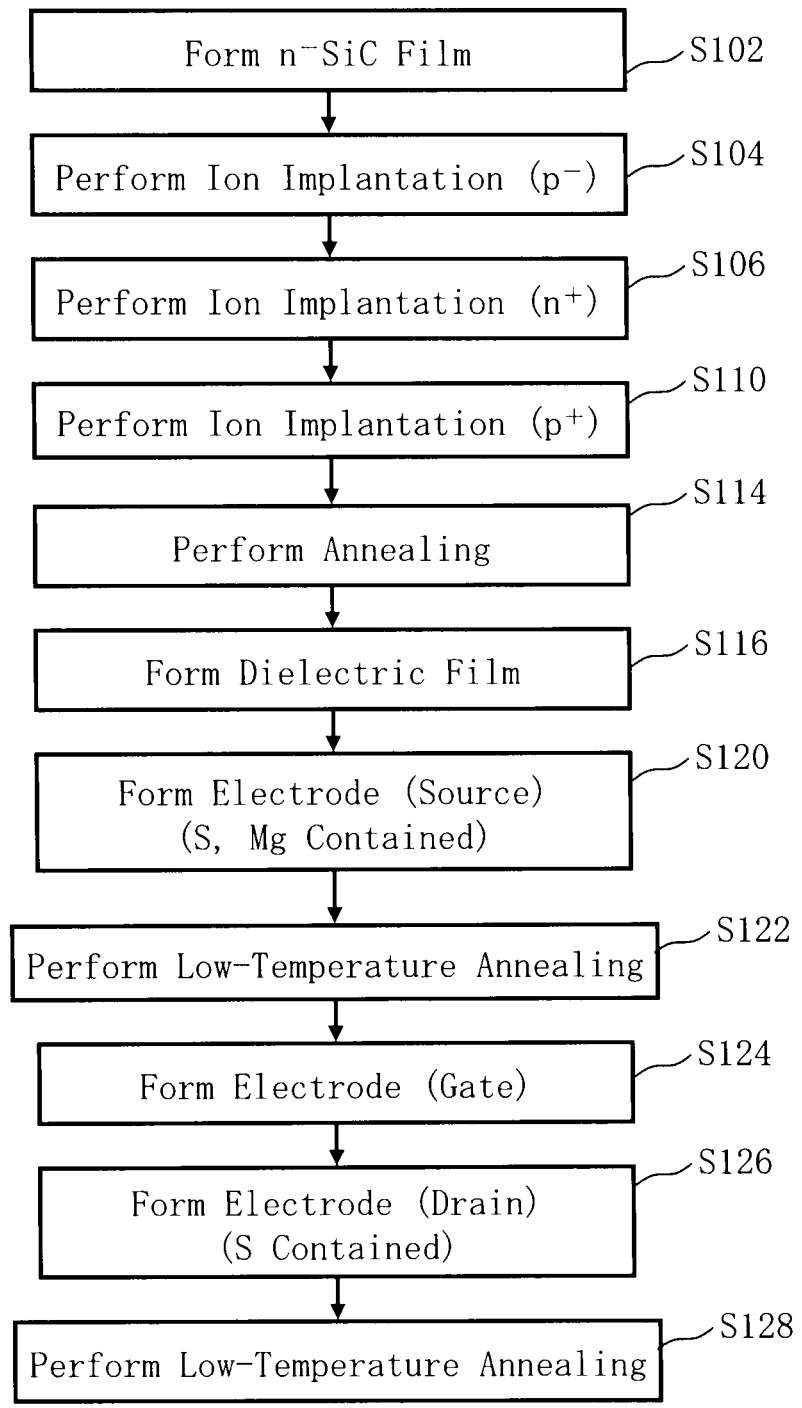
FIG. 12 is a flowchart showing principal processes of the method for fabricating the semiconductor device according to a second embodiment.

A flowchart showing principal processes of the method for fabricating the semiconductor device according to the second embodiment is shown in FIG. 12. FIG. 12 is similar to FIG. 5 except that the ion implantation process of a pinning material (S) (S108) and the ion implantation process of a pinning material (Mg) (S112) are deleted and an electrode (source electrode) formation process (S120) is added in place of the electrode (source electrode) formation process (S118). The configuration of the semiconductor device is similar to that in FIG. 1. Content that is not specifically mentioned below is similar to that in the first embodiment. The (n$^-$) SiC film formation process (S102) to the ion implantation process for (n$^+$) (S106) are similar to those in the first embodiment.

Figure 13A:
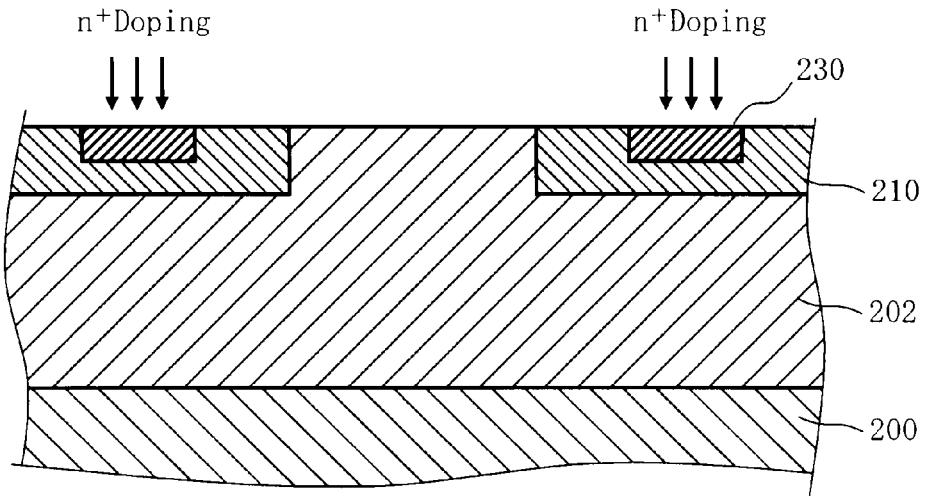
FIGS. 13A to 13C are process sectional views showing processes undergone corresponding to the flowchart of the method for fabricating the semiconductor device according to the second embodiment.
Figure 13B:
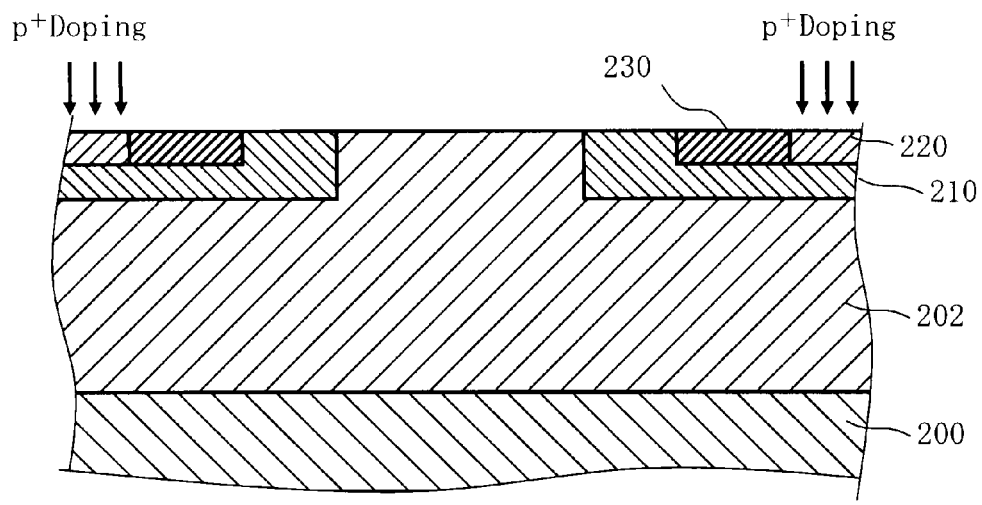
Figure 13C:
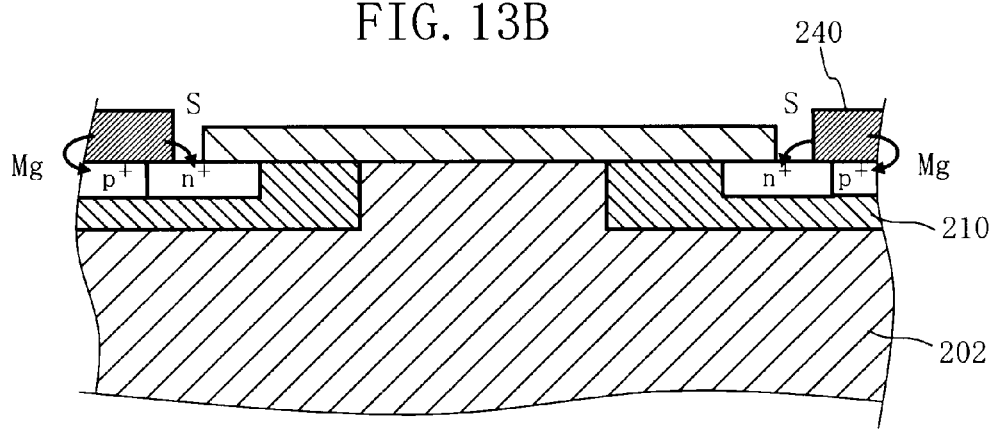

Process sectional views showing processes undergone corresponding to the flowchart of the method for fabricating the semiconductor device according to the second embodiment are shown in FIGS. 13A to 13C. In FIGS. 13A to 13C, the ion implantation process (S106) to the electrode (source electrode) formation process (S118) in FIG. 12 are shown.

In FIG. 13A, as the ion implantation process (S106), the (n$^+$) SiC semiconductor region 230 is formed by selectively implanting n-type conductive impurities into a portion of the surface of the (p$^-$) SiC semiconductor region 210. In the second embodiment, S ions are not subsequently implanted.

In FIG. 13B, as the ion implantation process for (p$^+$) (S110), the (p$^+$) SiC semiconductor region 220 is formed by selectively implanting p-type conductive impurities in another portion of the surface of the (p$^-$) SiC semiconductor regions 210 so as to be adjacent to the (n$^+$) SiC semiconductor region 230. In the second embodiment, Mg ions are not subsequently implanted.

The annealing process (S114) and the dielectric film formation process (S116) are executed in the same manner as in the first embodiment.

In FIG. 13C, as the electrode (source electrode) formation process (S120), like in the first embodiment, a conductive film of metal or the like is formed on the surface of the (p$^+$) SiC semiconductor region 220 and a portion of the surface of the (n$^+$) SiC semiconductor region 230 exposed by an opening formed after the resist film and the oxide film 250 are removed. The conductive film is formed by the sputter process using a target of a conductive material containing both S and Mg. Such a conductive film becomes the electrode 240. The electrode 240 is different from the electrode 240 in the first embodiment in that the "pinning material" is contained. A detailed description thereof will be provided with reference to FIGS. 11A and 11B. Then, the resist film is removed to remove (lift-off) the conductive film positioned on the resist film. If the width of the oxide film 250 is made narrower by etchback or the like, a gap can be formed between the oxide film 250 and the electrode 240 to avoid contact therebetween.

The subsequent processes are the same as those in the first embodiment. S is moved from the electrode 240 on the (n$^+$) SiC semiconductor region 230 and Mg is moved from the electrode 240 on the (p$^+$) SiC semiconductor region 220 by the low-temperature annealing process (S122) to the SiC side before being piled up in the interface portion. Then, like in the first embodiment, the (n$^+$) SiC semiconductor region 230 and the electrode 240 are ohmically connected. Similarly, the (p$^+$) SiC semiconductor region 220 and the electrode 240 are ohmically connected. In the present embodiment, the amount of the "pinning material (S)" in the interface between an n-type SiC region and metal is about 2×10$^{13}$/cm$^2$. The amount of the "pinning material (Mg)" in the interface between a p-type SiC region and metal is about 8×10$^{13}$/cm$^2$.

Alternatively, individual targets such as S and Mg may be sputtered simultaneously (co-sputtered) only near the interface. Mg in the n region receives electrons from the dopant (such as N) and thus does not work and Mg is not piled up in the interface of the n region. Similarly, S in the p region provides electrons to the dopant (such as Al) and thus does not work and S is not piled up in the interface of the p region. Thus, it turns out that a pinning material in the opposite direction causes no problem even if such a pinning material is present. That is, if both pinning materials are introduced, the pinning materials pin the effective work function of an electrode to the bottom of the conduction band in an n region and immediately above the valence band in a p region.

Alternatively, after an electrode being formed, ions of S or Mg may be implanted. To implant ions in an n region and a p region separately, a mask process is separately needed and also an alignment error causes a problem. However, implanting ions of both S and Mg in metal by using a mask pattern used for forming a metal film hardly causes a process load. In this case, both pinning materials are introduced into each of an n region and a p region and, as described above, the pinning materials pin the effective work function of an electrode to the bottom of the conduction band in the n region and immediately above the valence band in the p region. Se or Te may be used instead of S and Ca, Sr, or Ba may be used instead of Mg.

It is also possible to create only one of ohmic connection between an n region and metal and ohmic connection between a p region and metal. If, for example, an electrode in which Mg is introduced into Ni is created, the n region and Ni is ohmically connected. Mg is piled up in the interface of only the p region and the p region is also ohmically connected.

Also in the second embodiment, as described above, ohmic connection can be established for both the source electrode and the drain electrode. Thus, low-resistance contact between a p-type SiC region and metal can be made realizable. In the source electrode/p+ region interface, $1 \times 10^{-6}$ $\Omega cm^2$ is realizable as the contact resistance. Also, low-resistance contact between an n-type SiC region and metal at low temperature can be made realizable. In the source electrode/n+ region interface, $1 \times 10^{-7}$ $\Omega cm^2$ is realizable as the contact resistance. Further, one electrode can be connected to the p-type SiC region and the n-type SiC region simultaneously. The electrode is changed like the TiN electrode, polysilicon electrode, and W electrode, but no significant difference is found. However, if S or Mg is not introduced, electrode dependence appears intensely. It turns out that the channel mobility has a value (the peak value of 320 $cm^2$/Vs after passing through processes in the present embodiment), which is larger than a conventional value (the peak value of 20 $cm^2$/Vs after passing through the high-temperature heating process) by an order of magnitude.

Third Embodiment

In the first embodiment, a p-type dopant is selectively implanted into the ($n^-$) SiC semiconductor layer 202 to form a plurality of n-type SiC regions between p-type SiC regions, but the embodiments are not limited to this.

Figure 14:
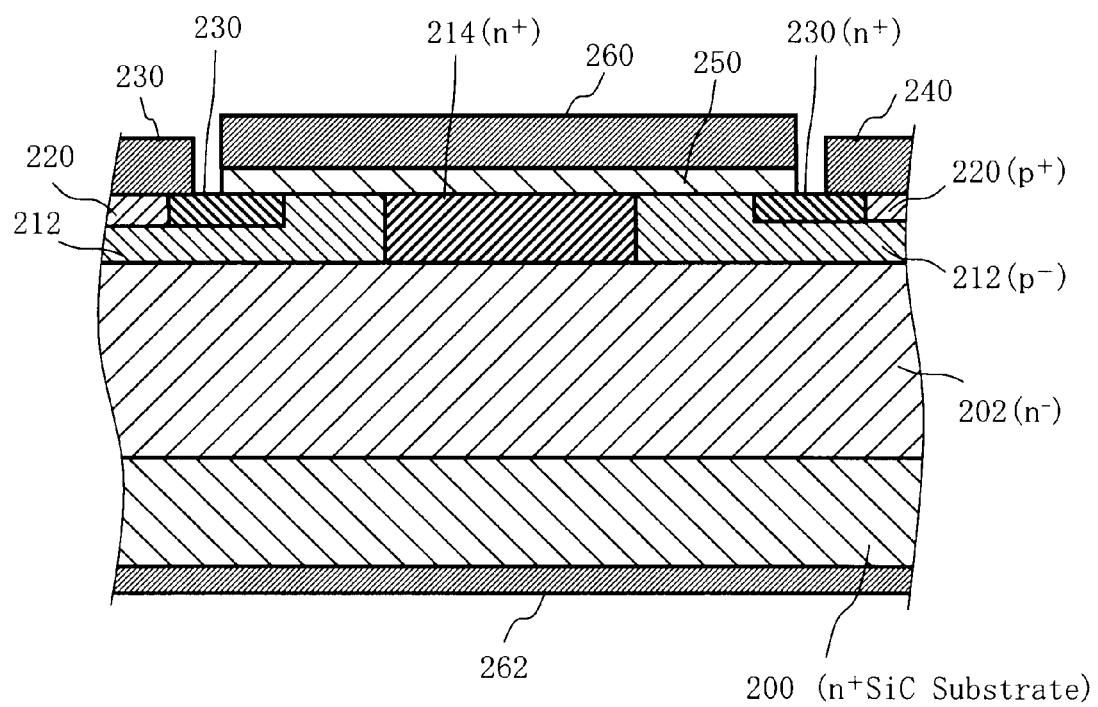
FIG. 14 is a sectional view showing the configuration of the semiconductor device according to a third embodiment.

FIG. 14 shows the configuration of the semiconductor device according to the third embodiment. In FIG. 14, like in FIG. 1, the structure section of DiMOSFET is shown. FIG. 14 is similar to FIG. 1 except that a plurality of low-concentration p-type ($p^-$) SiC semiconductor regions 212 with a predetermined thickness is formed with mutual spacing therebetween on the ($n^-$) SiC semiconductor layer 202 and a high-concentration n-type ($n^+$) SiC semiconductor region 214 is formed between the p-type ($p^-$) SiC semiconductor regions 212. Content other than specifically mentioned below is similar to that in the first embodiment.

Figure 15:
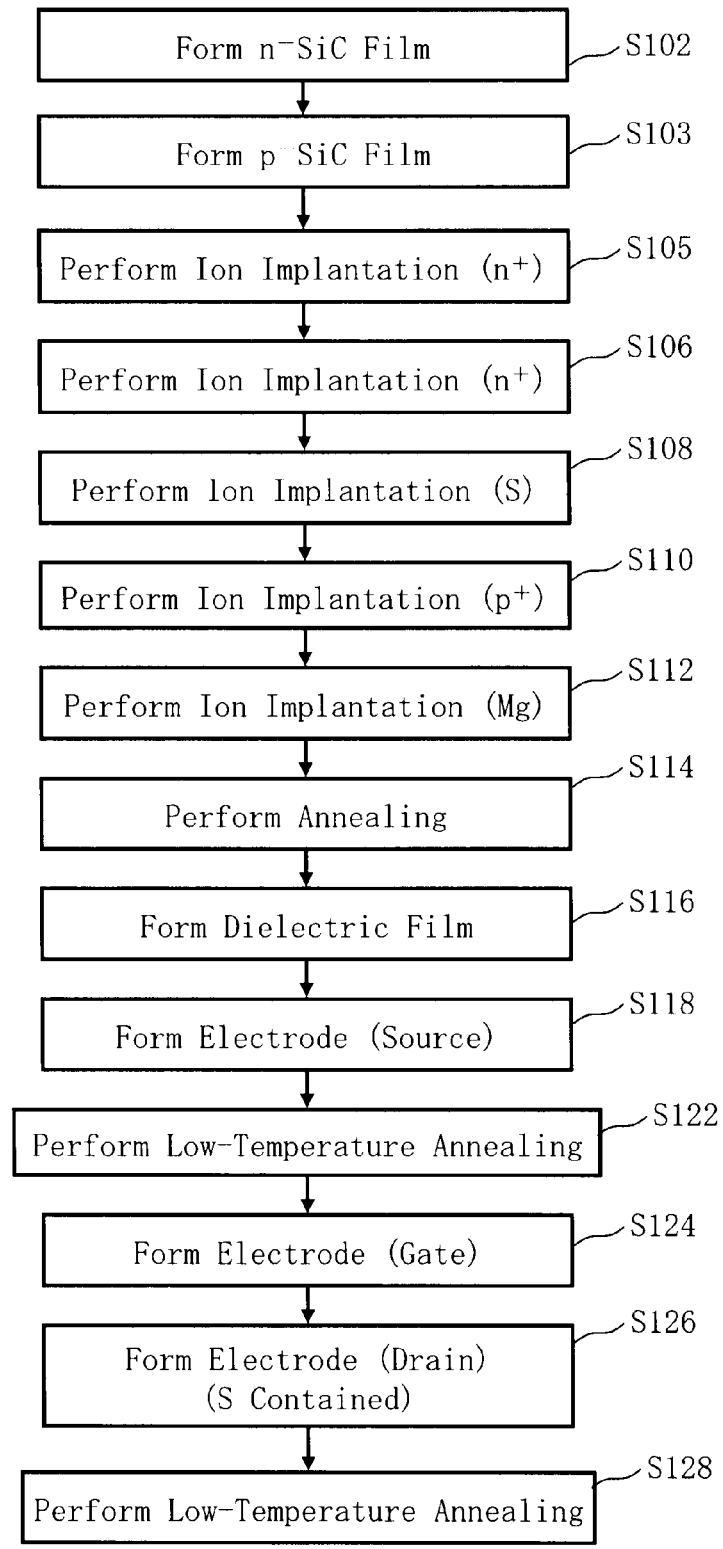
FIG. 15 is a flowchart showing principal processes of the method for fabricating the semiconductor device according to the third embodiment.

A flowchart showing principal processes of the method for fabricating the semiconductor device according to the third embodiment is shown in FIG. 15. FIG. 15 is similar to FIG. 5 except that in place of the ion implantation process for ($p^-$) (S104), a ($p^-$) SiC film formation process (S103) and an ion implantation process for ($n^+$) (S105) are added between the ($n^-$) SiC film formation process (S102) and the ion implantation process for ($n^+$) (S106).

Figure 16A:
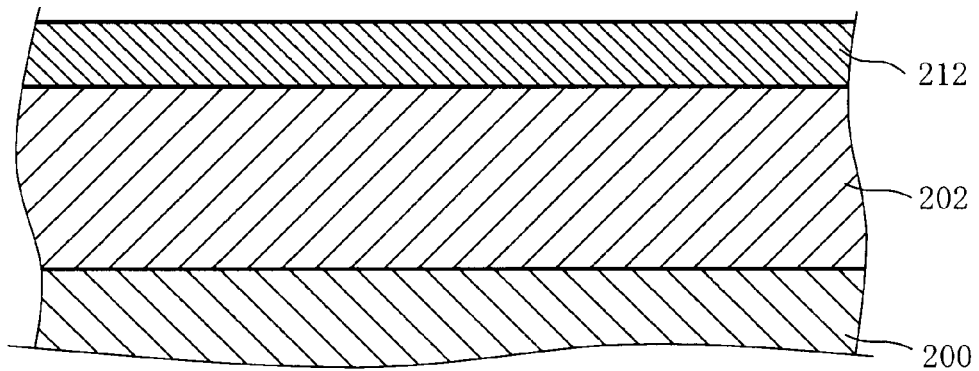
FIGS. 16A to 16C are process sectional views showing processes undergone corresponding to the flowchart of the method for fabricating the semiconductor device according to the third embodiment.
Figure 16B:
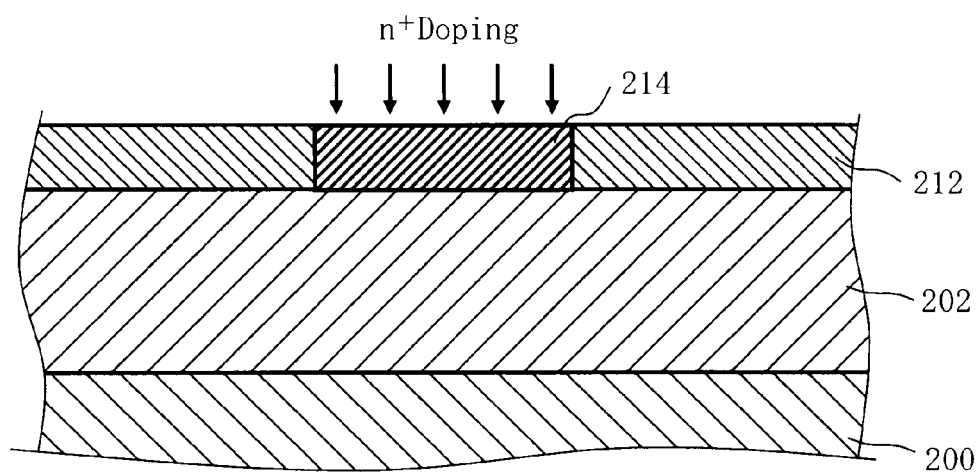
Figure 16C:
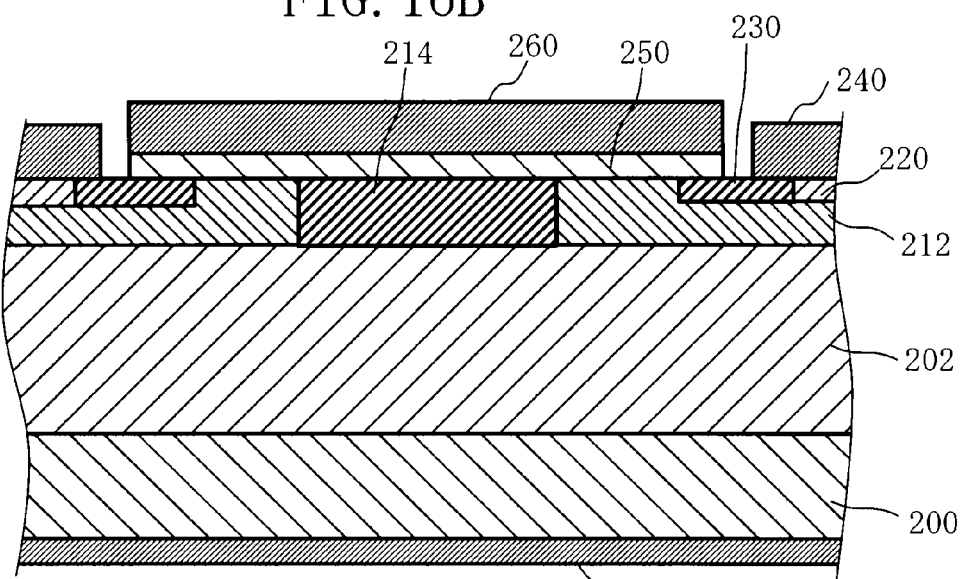

Processes undergone corresponding to the flowchart of the method for fabricating the semiconductor device according to the third embodiment are shown in FIGS. 16A to 16C. In FIGS. 16A to 16C, the ($p^-$) SiC film formation process (S103) to the low-temperature annealing process (S128) in FIG. 15 are shown.

In FIG. 16A, as the ($p^-$) SiC film formation process (S103), the p-type ($p^-$) SiC semiconductor layer 212 is epitaxially grown on the ($n^-$) SiC semiconductor layer 202. The p-type ($p^-$) SiC semiconductor layer 212 is formed to a thickness of, for example, 0.6 μm. In this case, the impurity concentration of 0.4 μm on the side of the ($n^+$) SiC semiconductor substrate 200 is suitably set to, for example, $4 \times 10^{17}$/$cm^3$ and the impurity concentration of 0.2 μm on the side of the surface is suitably set to, for example, $1 \times 10^{16}$/$cm^3$. Al may be used as the p-type impurity.

In FIG. 16B, as the ion implantation process for ($n^+$) (S105), ions of N are selectively implanted in the ($p^-$) SiC semiconductor layer 212 to form the ($n^+$) SiC semiconductor region 214. More specifically, an ion implantation mask is first formed. For example, a polysilicon film is grown and after a predetermined resist mask process is undergone, patterning of a polysilicon film is performed. In this case, strongly anisotropic conditions for etching polysilicon, for example, reactive ion etching is used to form the polysilicon film. Because the etching is anisotropic, the mask is patterned in a rectangular shape. The ion implantation mask is used to implant nitrogen ions for conversion from the p+ epitaxial layer into the n-type (the impurity concentration is suitably set to, for example, $1 \times 10^{16}$/$cm^3$) to link to the ($n^-$) SiC semiconductor layer 202 as the groundwork. Accordingly, the remaining ($p^-$) SiC semiconductor layer 212 that is not converted into the ($n^+$) SiC semiconductor region 214 becomes the ($p^-$) SiC semiconductor region 210 in FIG. 1.

The subsequent processes are the same as those in the first embodiment or the second embodiment. Accordingly, as shown in FIG. 16C, a semiconductor device equivalent to that in the first embodiment can be formed. In the third embodiment, there is no need for ion implantation in a MOS channel region and thus, forward characteristic deterioration caused by ion implantation can advantageously be prevented.

Fourth Embodiment

In the second embodiment, a p-type dopant is selectively implanted into the ($n^-$) SiC semiconductor layer 202 to form a plurality of n-type SiC regions between p-type SiC regions, but the embodiments are not limited to this.

The configuration of the semiconductor device according to the fourth embodiment is similar to that in FIG. 14. Content other than specifically mentioned below is similar to that in the second embodiment.

Figure 17:
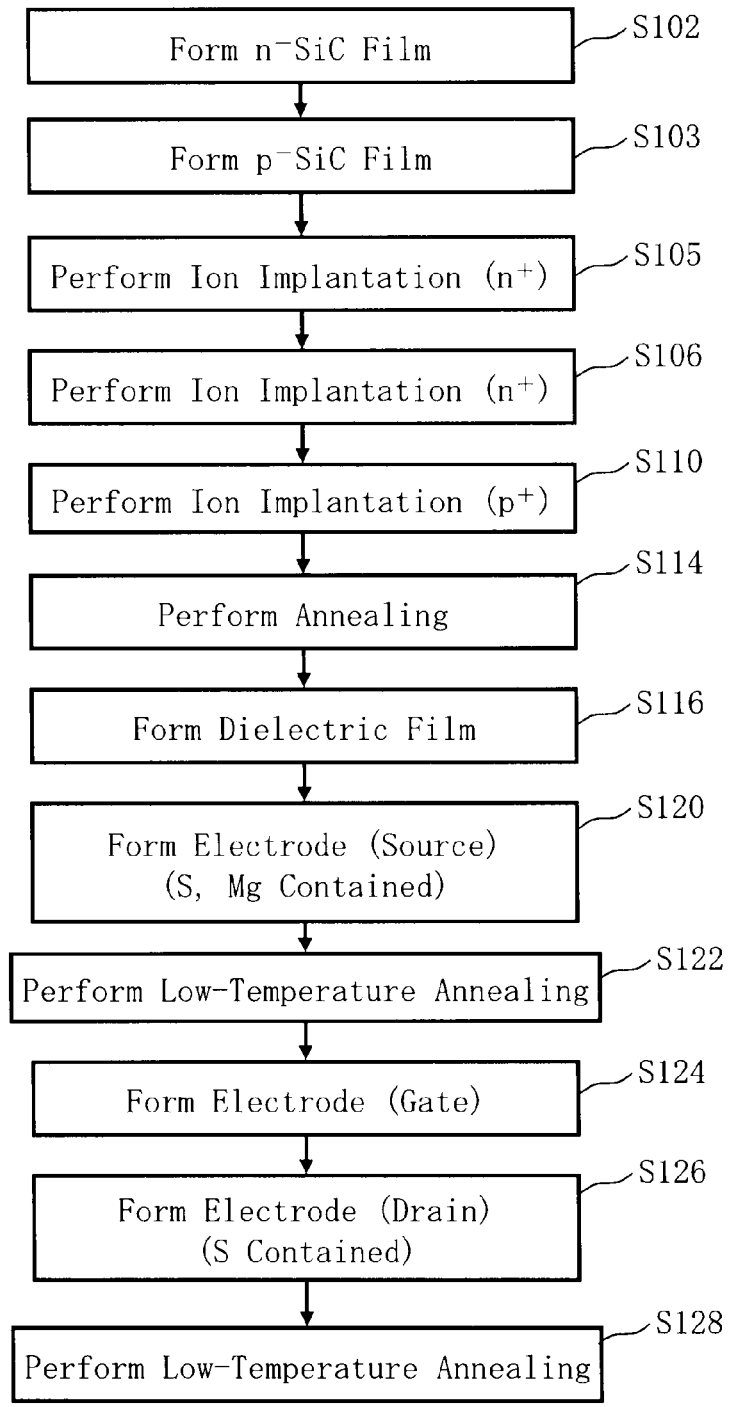
FIG. 17 is a flowchart showing principal processes of the method for fabricating the semiconductor device according to a fourth embodiment.

Principal processes of the method for fabricating the semiconductor device according to the fourth embodiment are shown in FIG. 17. FIG. 17 is similar to FIG. 12 except that in place of the ion implantation process for ($p^-$) (S104), the ($p^-$) SiC film formation process (S103) and the ion implantation process for ($n^+$) (S105) are added between the ($n^-$) SiC film formation process (S102) and the ion implantation process for ($n^+$) (S106). Content of the ($p^-$) SiC film formation process (S103) and the ion implantation process for ($n^+$) (S105) is similar to that in the third embodiment.

Accordingly, a semiconductor device equivalent to that in the second embodiment can be formed. In the fourth embodiment, there is no need for ion implantation in a MOS channel region and thus, forward characteristic deterioration caused by ion implantation can advantageously be prevented.

Fifth Embodiment

Each of the above embodiments has described DiMOSFET. However, application semiconductor devices are not limited to DiMOSFET. In the fifth embodiment, a case applied to IGBT (Insulated Gate Bipolar Transistor) will be described.

Figure 18:
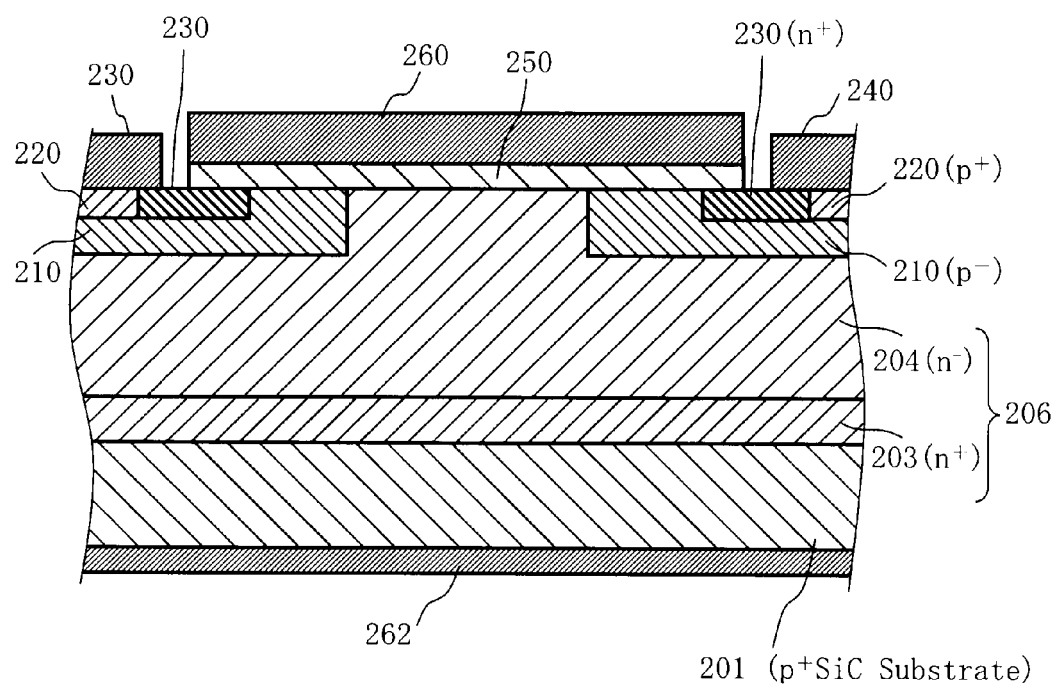
FIG. 18 is a sectional view showing the configuration of the semiconductor device according to a fifth embodiment.

The configuration of the semiconductor device according to the fifth embodiment is shown in FIG. 18. In FIG. 18, as an example, the structure section of IGBT is shown. FIG. 18 is similar to FIG. 1 except that a p-type ($p^+$) SiC semiconductor substrate 201 is used in place of the n-type ($n^+$) SiC semiconductor substrate 200 and a laminated structure of an (n⁺) SiC semiconductor layer 203 and an (n⁻) SiC semiconductor layer 204 is adopted as an n-type semiconductor layer 206 in place of the (n⁻) SiC semiconductor layer 202. In other words, the high-concentration n-type (n⁺) SiC semiconductor layer 203 (the impurity concentration is, for example, about $6×10^{17}/cm^3$) is formed and arranged on the surface of the high-concentration p-type (p⁺) SiC semiconductor substrate 201. Then, the low-concentration n-type (n⁻) SiC semiconductor layer 204 (the impurity concentration is, for example, about $5×10^{15}/cm^3$) is formed and arranged on the n-type (n⁺) SiC semiconductor layer 203. The n-type semiconductor layer 206 becomes a withstand voltage holding layer. The (p⁺) SiC semiconductor substrate 201 is an example of the first p-type SiC semiconductor part.

Then, the electrode 262 of a conductive material is connected and arranged on the back side of the (p⁺) SiC semiconductor substrate 201. The electrode 262 becomes a collector electrode. The electrode 262 becomes an example of the third electrode or an example of the second electrode. In this case, the (p⁺) SiC semiconductor substrate 201 contains at least one element of Mg, Ca, Sr, and Ba in an interface portion with the electrode 262 in such a way that the surface density thereof peaks. The electrode 262 is ohmically connected to the back side of the (p⁺) SiC semiconductor substrate 201. In the fifth embodiment, the electrode 240 becomes an emitter electrode. That the electrode 240 is ohmically connected to the n-type (n⁺) SiC semiconductor region 230 and the p-type (p⁺) SiC semiconductor region 220 is as described above.

As described above, by causing an interface portion with an electrode to contain a pinning material for each of n-type SiC and p-type SiC in such a way that the surface density thereof peaks, the resistance of each of n-type and p-type can be reduced. Further, an electrode of one type of metal can be formed simultaneously on the n-type (n⁺) SiC semiconductor region 230 and the p-type (p⁺) SiC semiconductor region 220. In the fifth embodiment, the reduction of resistance in the junction between the n-type (n⁺) SiC semiconductor region 230 and the electrode 240 to be an emitter electrode, the reduction of resistance in the junction between the p-type (p⁺) SiC semiconductor region 220 and the electrode 240 to be an emitter electrode, and the reduction of resistance in the junction between the back side of the (p⁺) SiC semiconductor substrate 201 and the electrode 262 to be a collector electrode can all be realized. However, the fifth embodiment is not limited to this and a configuration to realize only one or any two of the reduction of resistance in the junction between the n-type (n⁺) SiC semiconductor region 230 and the electrode 240 to be an emitter electrode, the reduction of resistance in the junction between the p-type (p⁺) SiC semiconductor region 220 and the electrode 240 to be an emitter electrode, and the reduction of resistance in the junction between the back side of the (p⁺) SiC semiconductor substrate 201 and the electrode 262 to be a collector electrode may be adopted.

Figure 19:
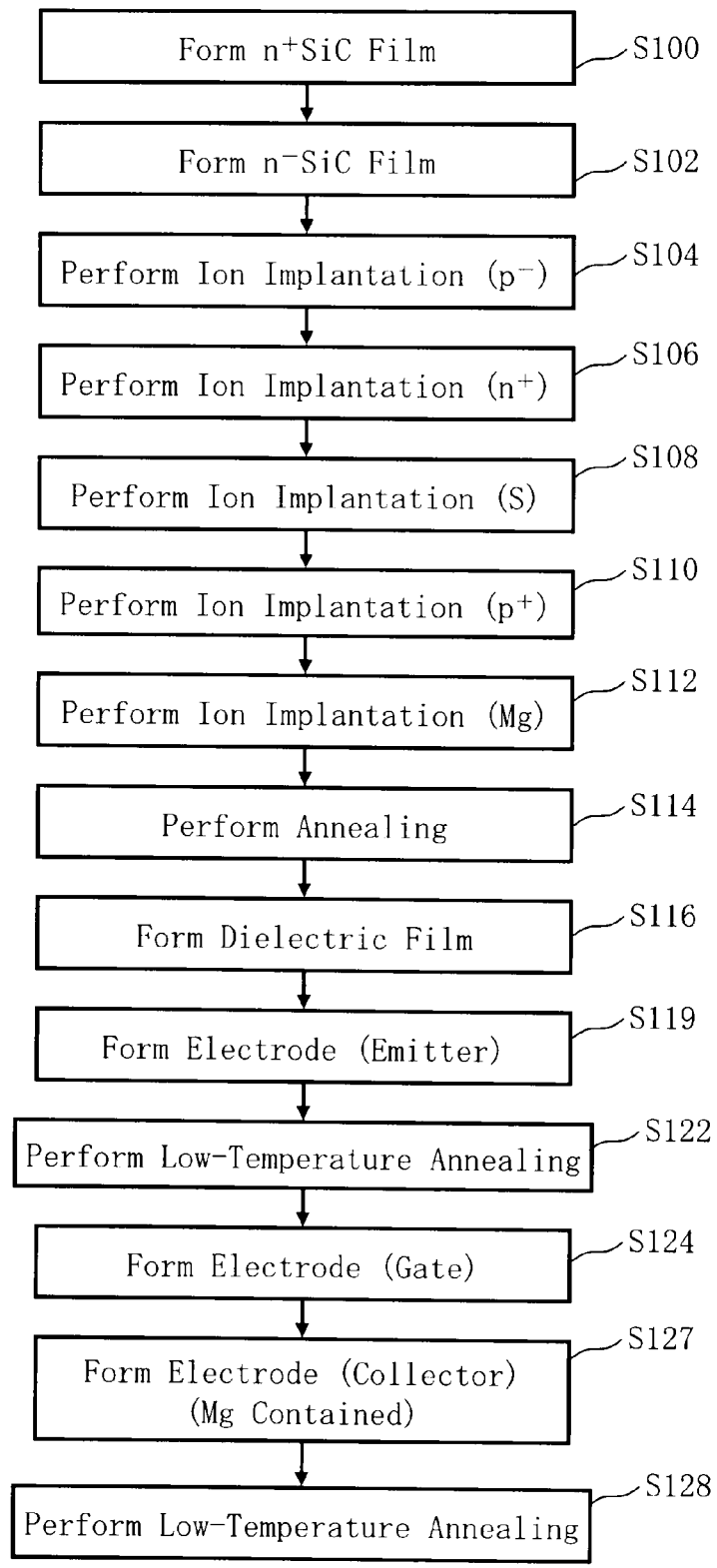
FIG. 19 is a flowchart showing principal processes of the method for fabricating the semiconductor device according to the fifth embodiment.

Principal processes of the method for fabricating the semiconductor device according to the fifth embodiment are shown in FIG. 19. FIG. 19 is similar to FIG. 5 except that an (n⁺) SiC film formation process (S100) is added before the (n⁻) SiC film formation process (S102), an electrode (emitter electrode) formation process (S119) is added in place of the electrode (source electrode) formation process (S118), and an electrode (collector electrode) formation process (S127) is added in place of the electrode (drain electrode) formation process (S126).

As the (n⁺) SiC film formation process (S100), the (n⁺) SiC semiconductor layer 203 is formed on the surface of the (p⁺) SiC semiconductor substrate 201. The (n⁺) SiC semiconductor layer 203 becomes a collector layer. The (n⁺) SiC semiconductor layer 203 is formed by epitaxial growth. N may be used as the impurity (dopant).

Then, as the (n⁻) SiC film formation process (S102), the (n⁻) SiC semiconductor layer 204 is formed on the (n⁺) SiC semiconductor layer 203. Like the (n⁺) SiC semiconductor layer 203, the (n⁻) SiC semiconductor layer 204 is formed by epitaxial growth. The (n⁻) SiC semiconductor layer 204 suitably has, for example, 0.5 µm or more and 20 µm or less as the film thickness. Here, the (n⁻) SiC semiconductor layer 204 is formed to a thickness of, for example, 10 µm.

Hereinafter, processes up to the dielectric film formation process (S116) are the same as those in the first embodiment. In the next electrode (emitter electrode) formation process (S119), content thereof is the same as that of the electrode (source electrode) formation process (S118) except that the source electrode is replaced by the emitter electrode. Hereinafter, processes up to the electrode (gate electrode) formation process (S124) are the same as those in the first embodiment.

As the electrode (collector electrode) formation process (S127), the electrode 262 to be a collector electrode is formed on the back side of the (p⁺) SiC semiconductor substrate 201. In FIG. 10, the electrode 262 is formed by forming a conductive film on the back side of the (p⁺) SiC semiconductor substrate 201 by the sputter process using the target 10 in which Mg instead of S is mixed in Ni to be an electrode material by 1 atomic percentage.

Then, as the low-temperature annealing process (S128), heat treatment at 400° C. is provided. For example, the heat treatment is to heat for 5 min in an argon (Ar) gas. With the heat treatment, Mg can be aggregated (piled up) in the interface between the electrode 262 and the (p⁺) SiC semiconductor substrate 201. In this case, while thin NiSi is formed near the interface, Mg is piled up in the interface with SiC so that an ohmic connection can be established.

According to the fifth embodiment, as described above, high-performance IGBT can be obtained. Due to a bipolar operation, conductivity modulation takes place, reducing the ON resistance. As a result, compared with the above DiMOS-FET, conducting performance can significantly be improved. In this case, not only an electron current, but also a hole current flows and thus, it is very important to reduce the contact resistance between the emitter electrode and the p+ region. The contact resistance that is sufficiently low can be obtained according to the fifth embodiment and thus, the technology according to the fifth embodiment is very effective for production of IGBT elements involving micropatterning in the future.

Sixth Embodiment

In the fifth embodiment, a case when the dopant and pinning material are co-doped for forming the (n⁺) SiC semiconductor region 230 has been described. Similarly, a case when the dopant and pinning material are co-doped for forming the (p⁺) SiC semiconductor region 220 has been described. In the sixth embodiment, the method of introducing the pinning material into the (n⁺) SiC semiconductor region 230 and the (p⁺) SiC semiconductor region 220 by using the sputter process will be described. The sixth embodiment corresponds to a case when the configuration according to the second embodiment is applied to IGBT.

Figure 20:
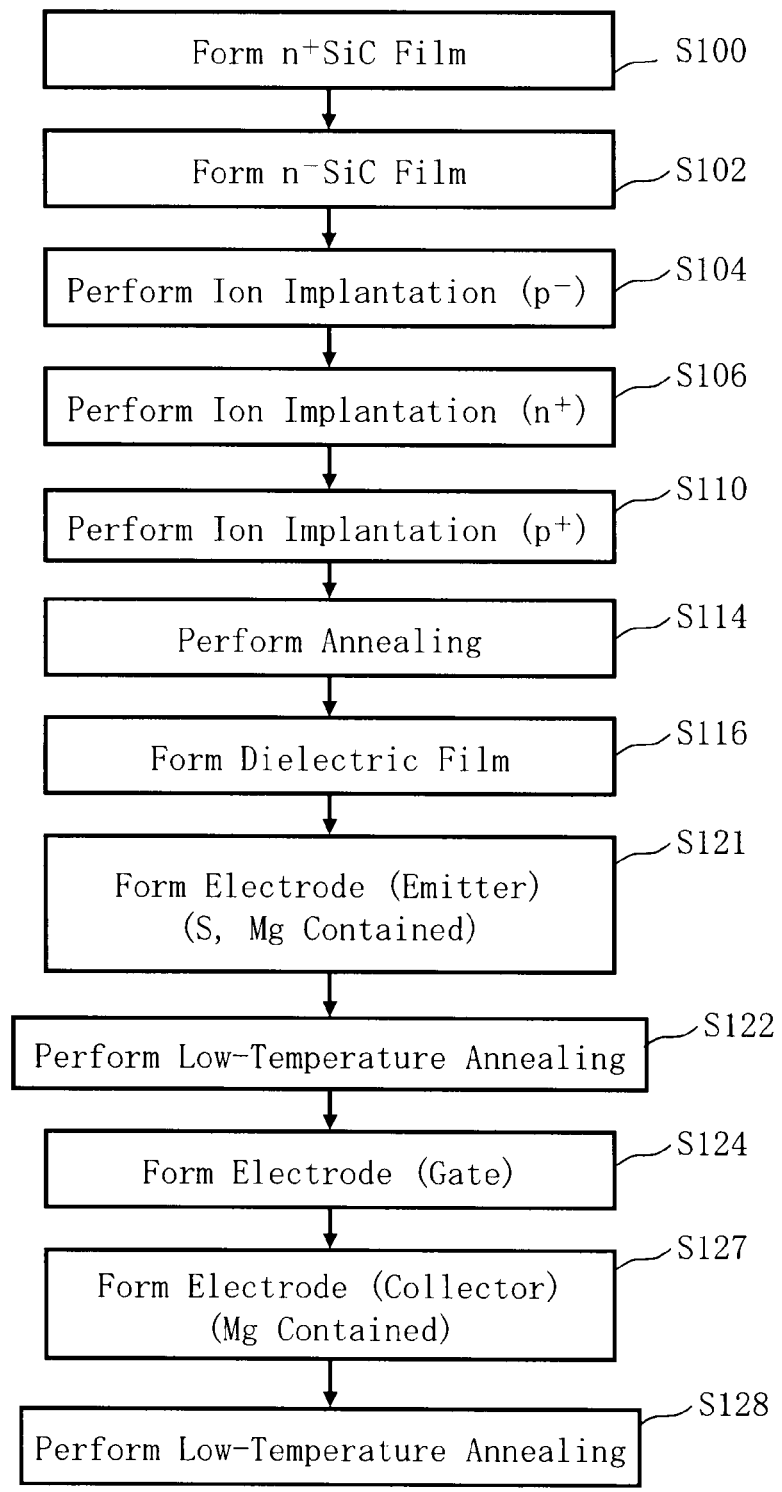
FIG. 20 is a flowchart showing principal processes of the method for fabricating the semiconductor device according to a sixth embodiment.

Principal processes of the method for fabricating the semiconductor device according to the sixth embodiment are shown in FIG. 20. FIG. 20 is similar to FIG. 19 except that the ion implantation process of a pinning material (S) (S108) and the ion implantation process of a pinning material (Mg) (S112) are deleted and an electrode (emitter electrode) formation process (S121) is added in place of the electrode (emitter electrode) formation process (S119). The configuration of the semiconductor device is similar to that in FIG. 18. Content that is not specifically mentioned below is similar to that in the fifth embodiment. Content of each process from the ion implantation process (S104) to the dielectric film formation process (S116) is the same as that in the second embodiment except that the ($n^-$) SiC semiconductor layer 202 is replaced by the ($n^-$) SiC semiconductor layer 204. Content of the electrode (emitter electrode) formation process (S121) is similar to that of the electrode (source electrode) formation process (S120) in the second embodiment except that the source electrode is replaced by the emitter electrode.

Also for IGBT, as described above, ohmic connection can be established for both the emitter electrode and the collector electrode. Thus, low-resistance contact between a p-type SiC region and metal can be made realizable. Also, low-resistance contact between an n-type SiC region and metal at low temperature can be made realizable. Further, one electrode can be connected to the p-type SiC region and the n-type SiC region simultaneously.

Seventh Embodiment

In the fifth embodiment, a p-type dopant is selectively implanted into the ($n^-$) SiC semiconductor layer 204 to form a plurality of n-type SiC regions between p-type SiC regions, but the embodiments are not limited to this. The seventh embodiment corresponds to a case when the configuration according to the third embodiment is applied to IGBT.

Figure 21:
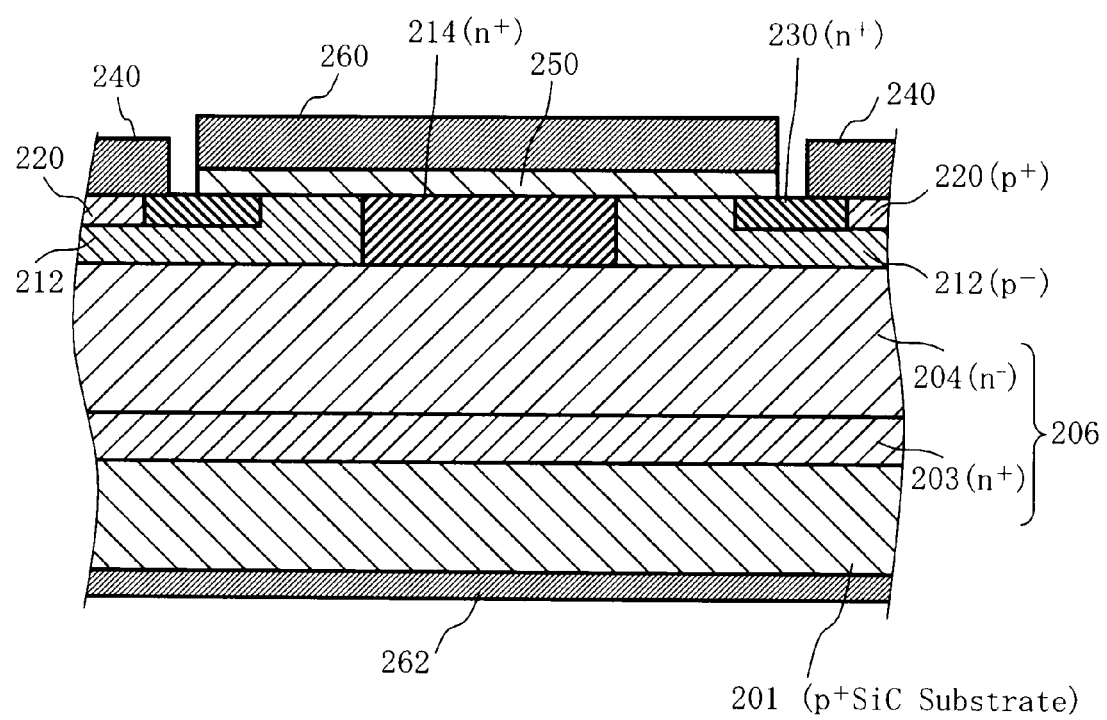
FIG. 21 is a sectional view showing the configuration of the semiconductor device according to a seventh embodiment.

The configuration of the semiconductor device according to the seventh embodiment is shown in FIG. 21. In FIG. 21, like in FIG. 18, the structure section of IGBT is shown. FIG. 21 is similar to FIG. 18 except that a plurality of low-concentration p-type ($p^-$) SiC semiconductor regions 212 with a predetermined thickness is formed with mutual spacing therebetween on the ($n^-$) SiC semiconductor layer 204 and the high-concentration n-type ($n^+$) SiC semiconductor region 214 is formed between the p-type ($p^-$) SiC semiconductor regions 212. Content other than specifically mentioned below is similar to that in the fifth embodiment.

Figure 22:
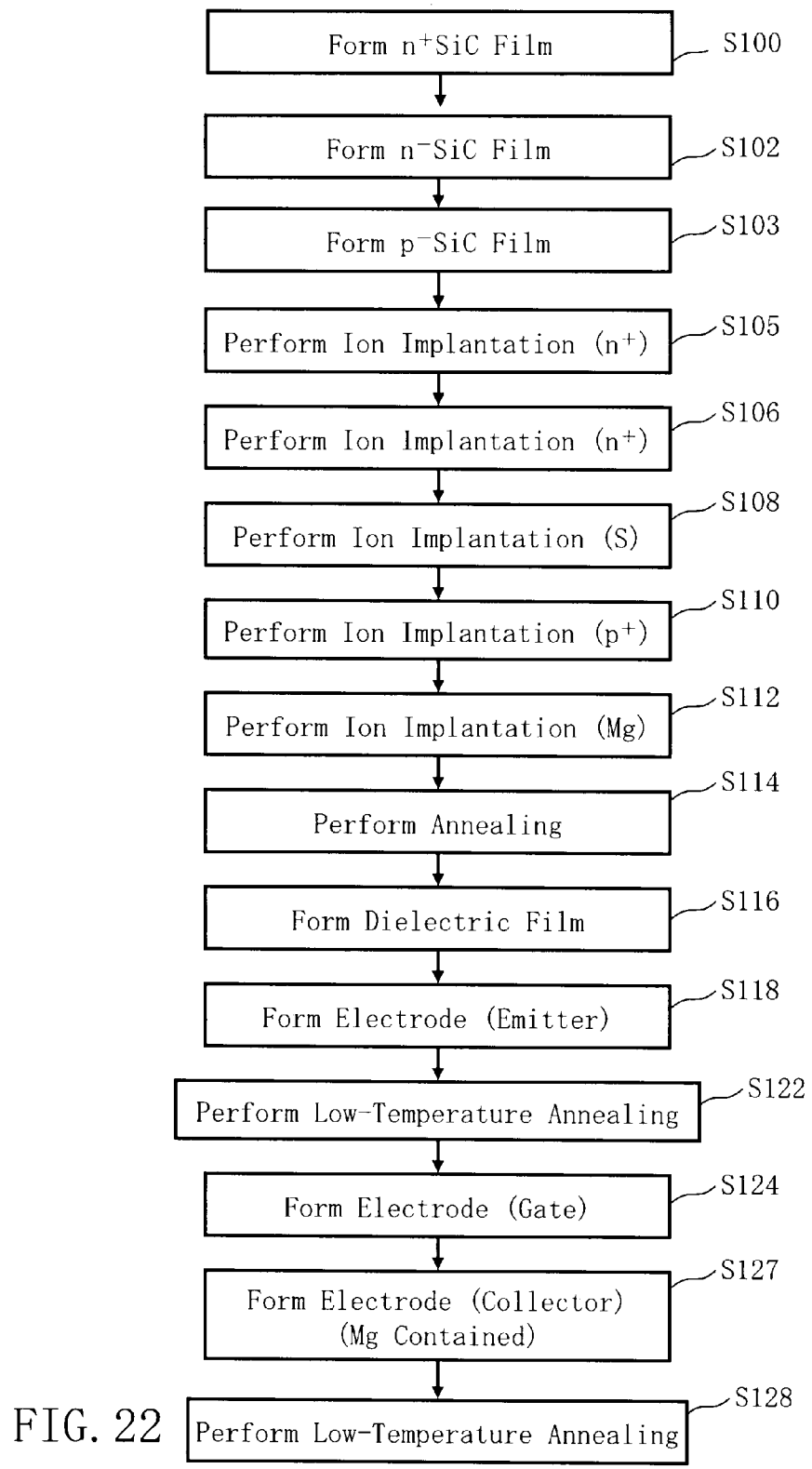
FIG. 22 is a flowchart showing principal processes of the method for fabricating the semiconductor device according to the seventh embodiment.

Principal processes of the method for fabricating the semiconductor device according to the seventh embodiment are shown in FIG. 22. FIG. 22 is similar to FIG. 19 except that in place of the ion implantation process for ($p^-$) (S104), the ($p^-$) SiC film formation process (S103) and the ion implantation process for ($n^+$) (S105) are added between the ($n^-$) SiC film formation process (S102) and the ion implantation process for ($n^+$) (S106). Content of the ($p^-$) SiC film formation process (S103) and the ion implantation process for ($n^+$) (S105) is similar to that in the third embodiment except that the ($n^-$) SiC semiconductor layer 202 is replaced by the ($n^-$) SiC semiconductor layer 204.

Eighth Embodiment

In the second embodiment, a p-type dopant is selectively implanted into the ($n^-$) SiC semiconductor layer 202 to form a plurality of n-type SiC regions between p-type SiC regions, but the embodiments are not limited to this. The eighth embodiment corresponds to a case when the configuration according to the fourth embodiment is applied to IGBT.

The configuration of the semiconductor device according to the eighth embodiment is similar to that in FIG. 21. Content other than specifically mentioned below is similar to that in the sixth embodiment.

Figure 23:
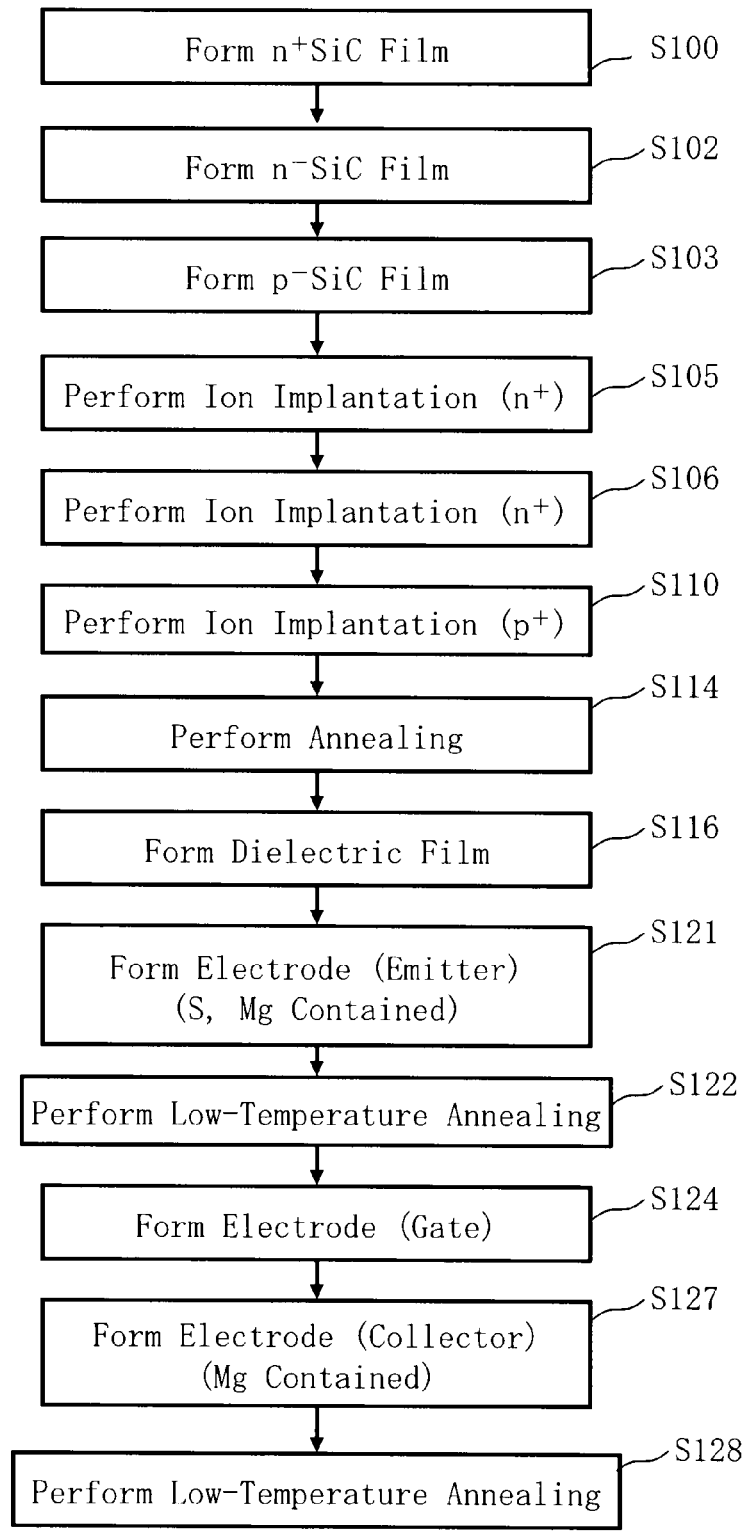
FIG. 23 is a flowchart showing principal processes of the method for fabricating the semiconductor device according to an eighth embodiment.

Principal processes of the method for fabricating the semiconductor device according to the eighth embodiment are shown in FIG. 23. FIG. 23 is similar to FIG. 20 except that in place of the ion implantation process for ($p^-$) (S104), the ($p^-$) SiC film formation process (S103) and the ion implantation process for ($n^+$) (S105) are added between the ($n^-$) SiC film formation process (S102) and the ion implantation process for ($n^+$) (S106). Content of the ($p^-$) SiC film formation process (S103) and the ion implantation process for ($n^+$) (S105) is similar to that in the fourth embodiment.

Ninth Embodiment

The technology to establish an ohmic connection between a conductive material and p-type SiC or n-type SiC by using the above pinning material is not limited to the above example. In the ninth embodiment, an example applied to a diode will be described.

Figure 24:
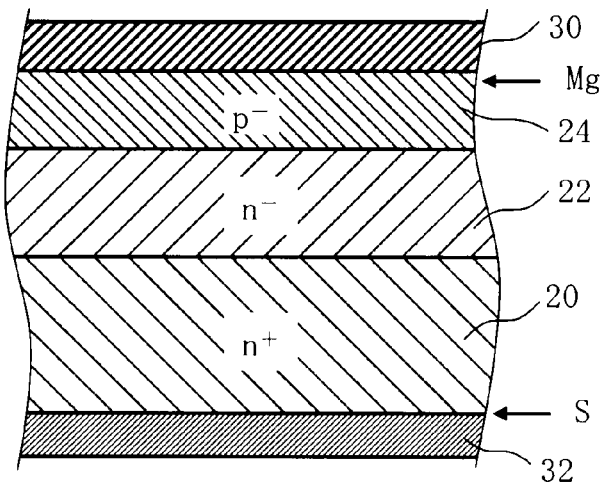
FIG. 24 is a sectional view showing the configuration of the semiconductor device according to a ninth embodiment.

The configuration of the semiconductor device according to the ninth embodiment is shown in FIG. 24. In FIG. 24, as an example, the structure section of a PiN diode is shown. In FIG. 24, an n-type ($n^-$) SiC semiconductor layer 22 is formed and arranged on the surface of a high-concentration n-type ($n^+$) SiC semiconductor substrate 20. The ($n^+$) SiC semiconductor substrate 20 is an example of the n-type SiC semiconductor part.

Then, an electrode 32 of a conductive material is connected and arranged on the back side of the ($n^+$) SiC semiconductor substrate 20. In this case, the ($n^+$) SiC semiconductor substrate 20 contains at least one element of S, Se, and Te in the interface portion with the electrode 32 in such a way that the surface density thereof peaks. In the present embodiment, the surface density is about $2\times10^{13}/cm^2$. The electrode 32 is ohmically connected to the back side of the ($n^+$) SiC semiconductor substrate 20. The method of forming the electrode 32 on the back side of the ($n^+$) SiC semiconductor substrate 20 may be a method similar to that of ohmically connecting an electrode made of metal or the like to n-type SiC in each of the above embodiments. The ($n^+$) SiC semiconductor substrate 20 is an example of the SiC semiconductor part.

Then, a p-type ($p^-$) SiC semiconductor region 24 is formed and arranged on the ($n^-$) SiC semiconductor layer 22. An electrode 30 of a conductive material is connected and arranged on the p-type ($p^-$) SiC semiconductor region 24. In this case, the ($p^-$) SiC semiconductor region 24 contains at least one element of Mg, Ca, Sr, and Ba in the interface portion with the electrode 30 in such a way that the surface density thereof peaks. In the present embodiment, the surface density is about $8\times10^{13}/cm^2$. The electrode 30 is ohmically connected to the ($p^-$) SiC semiconductor region 24. The ($p^-$) SiC semiconductor region 24 is an example of the first SiC semiconductor part. The method of forming the electrode 30 on the ($p^-$) SiC semiconductor region 24 may be a method similar to that of ohmically connecting an electrode made of metal or the like to p-type SiC in each of the above embodiments. By using such a pinning material, the ($p^-$) SiC semiconductor region 24 of low concentration, rather than high concentration, and the electrode 30 can ohmically be connected.

Tenth Embodiment

The technology to establish an ohmic connection between a conductive material and p-type SiC or n-type SiC by using the above pinning material is not limited to the above example. In the tenth embodiment, an example of another semiconductor device will be described.

Figure 25:
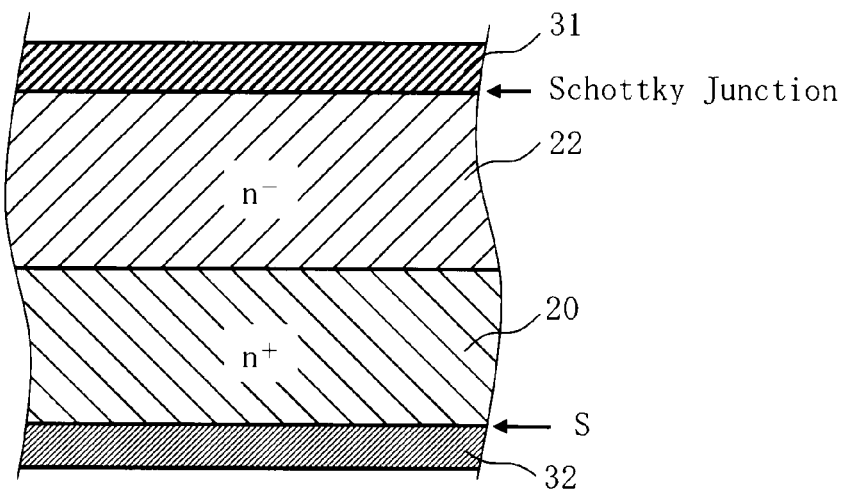
FIG. 25 is a sectional view showing the configuration of the semiconductor device according to a tenth embodiment.

The configuration of the semiconductor device according to the tenth embodiment is shown in FIG. 25. In FIG. 25, as an example, the structure section of a semiconductor device whose one electrode is Schottky-connected is shown. In FIG. 25, the n-type (n⁻) SiC semiconductor layer 22 is formed and arranged on the surface of the high-concentration n-type (n⁺) SiC semiconductor substrate 20. The (n⁺) SiC semiconductor substrate 20 is an example of the n-type SiC semiconductor part.

Then, the electrode 32 of a conductive material is connected and arranged on the back side of the (n⁺) SiC semiconductor substrate 20. In this case, the (n⁺) SiC semiconductor substrate 20 contains at least one element of S, Se, and Te in the interface portion with the electrode 32 in such a way that the surface density thereof peaks. In the present embodiment, the surface density is about $2 \times 10^{13}/cm^2$. The electrode 32 is ohmically connected to the back side of the (n⁺) SiC semiconductor substrate 20. The method of forming the electrode 32 on the back side of the (n⁺) SiC semiconductor substrate 20 may be a method similar to that of ohmically connecting an electrode made of metal or the like to n-type SiC in each of the above embodiments. The (n⁺) SiC semiconductor substrate 20 is an example of the SiC semiconductor part. Then, an electrode 31 made of metal is Schottky-connected onto the (n⁻) SiC semiconductor layer 22.

Eleventh Embodiment

The technology to establish an ohmic connection between a conductive material and p-type SiC or n-type SiC by using the above pinning material is not limited to the above example. In the eleventh embodiment, another example applied to a diode will be described.

Figure 26:
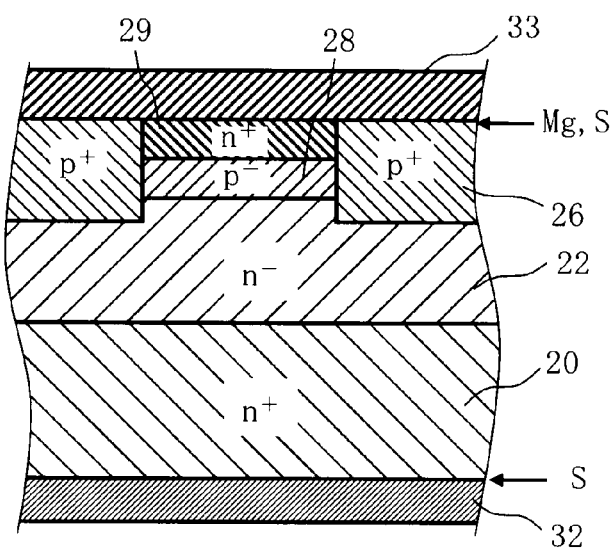
FIG. 26 is a sectional view showing the configuration of the semiconductor device according to an eleventh embodiment.

The configuration of the semiconductor device according to the eleventh embodiment is shown in FIG. 26. In FIG. 26, the n-type (n⁻) SiC semiconductor layer 22 is formed and arranged on the surface of the high-concentration n-type (n⁺) SiC semiconductor substrate 20. The (n⁺) SiC semiconductor substrate 20 is an example of the n-type SiC semiconductor part.

Then, the electrode 32 of a conductive material is connected and arranged on the back side of the (n⁺) SiC semiconductor substrate 20. In this case, the (n⁺) SiC semiconductor substrate 20 contains at least one element of S, Se, and Te in the interface portion with the electrode 32 in such a way that the surface density thereof peaks. In the present embodiment, the surface density is about $2 \times 10^{13}/cm^2$. The electrode 32 is ohmically connected to the back side of the (n⁺) SiC semiconductor substrate 20. The method of forming the electrode 32 on the back side of the (n⁺) SiC semiconductor substrate 20 may be a method similar to that of ohmically connecting an electrode made of metal or the like to n-type SiC in each of the above embodiments. The (n⁺) SiC semiconductor substrate 20 is an example of the SiC semiconductor part.

Then, a plurality of p-type (p⁺) SiC semiconductor regions 26 is selectively formed on the (n⁻) SiC semiconductor layer 22. Then, a p-type (p⁻) SiC semiconductor region 28 and an n-type (n⁺) SiC semiconductor region 29 are formed between the (p⁺) SiC semiconductor regions 26 and arranged in this order from below. Then, one electrode 33 is connected onto the (n⁺) SiC semiconductor region 29 between the (p⁺) SiC semiconductor regions 26 on both sides. In this case, the (p⁺) SiC semiconductor region 26 contains at least one element of Mg, Ca, Sr, and Ba in the interface portion with the electrode 33 in such a way that the surface density thereof peaks. In the present embodiment, the surface density is about $8 \times 10^{13}/cm^2$. The electrode 33 is ohmically connected to the p-type (p⁺) SiC semiconductor region 26. The p-type (p⁺) SiC semiconductor region 26 is an example of the first SiC semiconductor part. The method of forming the electrode 33 on the p-type (p⁺) SiC semiconductor region 26 may be a method similar to that of ohmically connecting an electrode made of metal or the like to p-type SiC in each of the above embodiments.

Similarly, the (n⁺) SiC semiconductor region 29 contains at least one element of S, Se, and Te in the interface portion with the electrode 33 in such a way that the surface density thereof peaks. In the present embodiment, the surface density is about $2 \times 10^{13}/cm^2$. The electrode 33 is ohmically connected to the (n⁺) SiC semiconductor region 29. The method of forming the electrode 33 on the (n⁺) SiC semiconductor region 29 may be a method similar to that of ohmically connecting an electrode made of metal or the like to n-type SiC in each of the above embodiments. The (n⁺) SiC semiconductor region 29 is an example of the SiC semiconductor part or the second SiC semiconductor part.

The embodiments have been described above with reference to the concrete examples. However, the embodiments are not limited to the concrete examples. SiC is used as a series of semiconductor material in the above embodiments, but the embodiments are not limited to this. Particularly, the embodiments are effective for materials whose position of the valence band from the vacuum is 5.7 eV or more. The embodiments are effective when the diffusion in a semiconductor part is small and thus more effective with a smaller lattice constant than that of Si. Similar effects can also be gained if, for example, gallium nitride (GaN), diamond or the like is used as a series of semiconductor material.

The thickness of each layer (film), the size, shape, and number of openings can appropriately be selected and used for what is needed in semiconductor integrated circuits and various semiconductor elements.

In addition, all methods of fabricating a semiconductor device which include the elements of the embodiments and can be obtained by arbitrary change of design by a person skilled in the art are included in the spirit and scope of the embodiments.

For the sake of convenience of description, techniques commonly used in semiconductor industry, for example, the photolithography process and cleaning before/after treatment are omitted, but such techniques are naturally included in the scope of the embodiments are.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:
1. A semiconductor device, comprising:
a first electrode using a conductive material;
a first silicon carbide (SiC) semiconductor part connected to the first electrode, in which at least one element of magnesium (Mg), calcium (Ca), strontium (Sr), and barium (Ba) is contained in an interface portion with the first electrode in such a way that a surface density thereof peaks, and whose conduction type is p-type; and a second SiC semiconductor part connected to the first electrode, in which at least one element of sulfur (S), selenium (Se), and tellurium (Te) is contained in an interface portion with the first electrode in such a way that a surface density thereof peaks, and whose conduction type is n-type.

2. The device according to claim 1, further comprising:
an SiC semiconductor substrate;
an n-type SiC semiconductor layer formed on the SiC semiconductor substrate;
a plurality of third SiC semiconductor parts selectively formed on at least a portion of the n-type SiC semiconductor layer and arranged by being connected to the first and second SiC semiconductor parts, wherein each of the plurality of third SiC semiconductor parts has a p-type conduction type;
a gate dielectric film formed on the second and third SiC semiconductor parts;
a second electrode formed on the gate dielectric film; and
a third electrode formed on a back surface of the SiC semiconductor substrate.

3. The device according to claim 2, wherein the SiC semiconductor substrate has an n-type conduction type.

4. The device according to claim 3, wherein the SiC semiconductor substrate contains at least one element of sulfur (S), selenium (Se), and tellurium (Te) in an interface portion with the third electrode in such a way that a surface density thereof peaks.

5. The device according to claim 2, wherein the SiC semiconductor substrate has a p-type conduction type.

6. The device according to claim 5, wherein the SiC semiconductor substrate contains at least one element of magnesium (Mg), calcium (Ca), strontium (Sr), and barium (Ba) in an interface portion with the third electrode in such a way that a surface density thereof peaks.

7. The device according to claim 1, wherein the first SiC semiconductor part is an SiC semiconductor substrate whose conduction type is p-type.

8. A semiconductor device, comprising:
a first electrode using a conductive material;
a first silicon carbide (SiC) semiconductor part connected to the first electrode, in which at least one element of magnesium (Mg), calcium (Ca), strontium (Sr), and barium (Ba) is contained in an interface portion with the first electrode in such a way that a suface density thereof peaks, and whose conduction type is p-type;
a second SiC semiconductor part connected to the first electrode and whose conduction type is n-type;
an SiC semiconductor substrate;
an n-type SiC semiconductor layer formed on the SiC semiconductor substrate;
a plurality of third SiC semiconductor parts selectively formed on at least a portion of the n-type SiC semiconductor layer and arranged by being connected to the first and second SiC semiconductor parts, wherein each of the plurality of third SiC semiconductor parts has a p-type conduction type;
a gate dielectric film formed on the second and third SiC semiconductor parts;
a second electrode formed on the gate dielectric film; and
a third electrode formed on a back surface of the SiC semiconductor substrate.

9. The device according to claim 8, wherein the SiC semiconductor substrate has an n-type conduction type.

10. The device according to claim 9, wherein the SiC semiconductor substrate contains at least one element of sulfur (S), selenium (Se), and tellurium (Te) in an interface portion with the third electrode in such a way that a surface density thereof peaks.

11. The device according to claim 8, wherein the SiC semiconductor substrate has a p-type conduction type.

12. The device according to claim 11, wherein the SiC semiconductor substrate contains at least one element of magnesium (Mg), calcium (Ca), strontium (Sr), and barium (Ba) in an interface portion with the third electrode in such a way that a surface density thereof peaks.

13. A semiconductor device, comprising:
an electrode using a conductive material; and
a silicon carbide (SiC) semiconductor part connected to the electrode, in which at least one element of sulfur (S), selenium (Se), and tellurium (Te) is contained in an interface portion with the electrode in such a way that a surface density thereof peaks, and whose conduction type is n-type.

14. The device according to claim 13, wherein the SiC semiconductor part is an SiC semiconductor substrate whose conduction type is n-type.

15. The device according to claim 13, wherein the electrode is a first electrode, further comprising:
an SiC semiconductor substrate whose conduction type is n-type; and
a second electrode formed on a back surface of the SiC semiconductor substrate,
wherein the SiC semiconductor part is formed above the SiC semiconductor substrate.

16. The device according to claim 15, wherein the SiC semiconductor substrate contains at least one element of sulfur (S), selenium (Se), and tellurium (Te) in an interface portion with the second electrode in such a way that a surface density thereof peaks.

17. The device according to claim 13, wherein the electrode is a first electrode, further comprising:
an SiC semiconductor substrate whose conduction type is p-type; and
a second electrode formed on a back surface of the SiC semiconductor substrate,
wherein the SiC semiconductor part is formed above the SiC semiconductor substrate.

18. The device according to claim 17, wherein the SiC semiconductor substrate contains at least one element of magnesium (Mg), calcium (Ca), strontium (Sr), and barium (Ba) in an interface portion with the second electrode in such a way that a surface density thereof peaks.

* * * * *